(12) United States Patent
Masunaga et al.

(10) Patent No.: US 8,470,511 B2
(45) Date of Patent: Jun. 25, 2013

(54) CHEMICALLY AMPLIFIED NEGATIVE RESIST COMPOSITION FOR EB OR EUV LITHOGRAPHY AND PATTERNING PROCESS

(75) Inventors: Keiichi Masunaga, Joetsu (JP); Satoshi Watanabe, Joetsu (JP); Akinobu Tanaka, Joetsu (JP); Daisuke Domon, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 127 days.

(21) Appl. No.: 13/027,446

(22) Filed: Feb. 15, 2011

(65) Prior Publication Data

US 2011/0200942 A1 Aug. 18, 2011

(30) Foreign Application Priority Data

Feb. 16, 2010 (JP) .................................. 2010-031020

(51) Int. Cl.
*G03F 7/00* (2006.01)
*G03F 7/004* (2006.01)
*G03F 7/20* (2006.01)

(52) U.S. Cl.
USPC ............ 430/270.1; 430/5; 430/913; 430/927; 430/905; 430/942

(58) Field of Classification Search
USPC ............... 430/270.1, 5, 280.1, 913, 927, 905, 430/942
See application file for complete search history.

(56) References Cited

U.S. PATENT DOCUMENTS

| | | | |
|---|---|---|---|
| 6,284,863 B1 | 9/2001 | Ohta et al. | |
| 6,306,555 B1 * | 10/2001 | Schulz et al. | 430/270.1 |
| 7,195,846 B2 * | 3/2007 | Kaneko et al. | 430/5 |
| 7,244,542 B2 * | 7/2007 | Bae et al. | 430/270.1 |
| 7,252,924 B2 * | 8/2007 | Yamanaka et al. | 430/270.1 |
| 7,449,277 B2 * | 11/2008 | Hatakeyama et al. | 430/270.1 |
| 7,491,483 B2 * | 2/2009 | Hatakeyama et al. | 430/270.1 |
| 7,960,091 B2 * | 6/2011 | Shimizu et al. | 430/270.1 |
| 8,057,982 B2 * | 11/2011 | Hatakeyama et al. | 430/270.1 |
| 8,105,748 B2 * | 1/2012 | Ohashi et al. | 430/270.1 |
| 2006/0134547 A1 * | 6/2006 | Huang et al. | 430/270.1 |
| 2006/0166133 A1 | 7/2006 | Koitabashi et al. | |
| 2008/0020290 A1 * | 1/2008 | Hatakeyama et al. | 430/4 |
| 2008/0096128 A1 | 4/2008 | Takeda et al. | |
| 2008/0241751 A1 | 10/2008 | Takeda et al. | |
| 2009/0087789 A1 | 4/2009 | Hirano et al. | |
| 2009/0124726 A1 * | 5/2009 | Goh et al. | 523/204 |
| 2009/0197197 A1 * | 8/2009 | Shimizu et al. | 430/270.1 |
| 2009/0202943 A1 * | 8/2009 | Ohsawa et al. | 430/285.1 |
| 2009/0269696 A1 | 10/2009 | Ohsawa et al. | |
| 2009/0269701 A1 * | 10/2009 | Irie et al. | 430/285.1 |
| 2010/0167200 A1 * | 7/2010 | Choi et al. | 430/270.1 |
| 2010/0297554 A1 * | 11/2010 | Watanabe et al. | 430/270.1 |
| 2010/0304301 A1 * | 12/2010 | Tanaka et al. | 430/285.1 |
| 2011/0003247 A1 * | 1/2011 | Ohashi et al. | 430/270.1 |
| 2011/0033799 A1 * | 2/2011 | Watanabe et al. | 430/270.1 |
| 2011/0039204 A1 * | 2/2011 | Ohashi et al. | 430/270.1 |
| 2011/0129765 A1 * | 6/2011 | Tanaka et al. | 430/5 |
| 2011/0143266 A1 * | 6/2011 | Tanaka et al. | 430/5 |

FOREIGN PATENT DOCUMENTS

| | | |
|---|---|---|
| CN | 1825206 A | 8/2006 |
| CN | 101387831 A | 3/2009 |
| EP | 1 684 118 A1 | 7/2006 |
| EP | 1 975 711 A1 | 10/2008 |
| EP | 2 042 925 A2 | 4/2009 |
| EP | 2 042 925 A3 | 6/2009 |
| EP | 2 112 554 A2 | 10/2009 |
| EP | 2146245 A2 | 1/2010 |
| EP | 2 112 554 A3 | 12/2010 |
| JP | 2008-133312 A | 6/2006 |
| JP | 2006-201532 A | 8/2006 |
| JP | 2006-215180 A | 8/2006 |
| JP | 2008-102383 A | 5/2008 |
| JP | 2008-107677 A | 5/2008 |
| JP | 2008197606 A * | 8/2008 |
| JP | 2008-249762 A | 10/2008 |
| JP | 2009-86310 A | 4/2009 |
| JP | 2009-263487 A | 11/2009 |

OTHER PUBLICATIONS

Machine translation of JP 2008-197606 (no date).*
Extended European Search Report dated Jul. 4, 2011 for European Application No. 11001083.2.

\* cited by examiner

*Primary Examiner* — Amanda C. Walke
(74) *Attorney, Agent, or Firm* — Birch, Stewart, Kolasch & Birch, LLP

(57) ABSTRACT

A chemically amplified negative resist composition is provided comprising (A) an alkali-soluble polymer, (B) an acid generator, and (C) a nitrogen-containing compound as a basic component, the polymer (A) turning alkali insoluble under the catalysis of acid. A basic polymer having a secondary or tertiary amine structure on a side chain serves as components (A) and (C). Processing the negative resist composition by EB or EUV lithography process may form a fine size resist pattern with advantages including uniform diffusion of base, improved LER, controlled deactivation of acid at the substrate interface, and a reduced degree of undercut.

17 Claims, No Drawings

US 8,470,511 B2

CHEMICALLY AMPLIFIED NEGATIVE RESIST COMPOSITION FOR EB OR EUV LITHOGRAPHY AND PATTERNING PROCESS

CROSS-REFERENCE TO RELATED APPLICATION

This non-provisional application claims priority under 35 U.S.C. §119(a) on Patent Application No. 2010-031020 filed in Japan on Feb. 16, 2010, the entire contents of which are hereby incorporated by reference.

TECHNICAL FIELD

This invention relates to a chemically amplified negative resist composition for EB or EUV lithography and more particularly, to a chemically amplified negative resist composition comprising a basic polymer for use in processing of semiconductor and photomask substrates by EB or EUV lithography, and a patterning process using the same.

BACKGROUND ART

In the recent drive for higher integration and operating speeds in LSI devices, it is desired to miniaturize the pattern rule. The exposure process and the resist composition are largely altered to meet such a demand. Particularly when resist patterns with a feature size of 0.2 µm or less are formed by lithography, KrF and ArF excimer laser radiation, electron beam (EB), and the like are used as the light source for exposure, and chemically amplified resist compositions having a high sensitivity to such high-energy radiation and affording a high resolution are used as the photoresist.

Resist compositions include positive ones in which exposed areas are dissolved away and negative ones in which exposed areas are left as a pattern. A suitable composition is selected among them depending on the desired resist pattern. In general, the chemically amplified negative resist composition comprises a polymer which is normally soluble in an aqueous alkaline developer, an acid generator which is decomposed to generate an acid upon exposure to light, and a crosslinker which causes the polymer to crosslink in the presence of the acid serving as a catalyst, thus rendering the polymer insoluble in the developer (sometimes, the crosslinker is incorporated in the polymer). Typically a basic compound is added for controlling the diffusion of the acid generated upon light exposure.

A number of negative resist compositions of the type comprising a polymer which is soluble in an aqueous alkaline developer and includes phenolic units as the alkali-soluble units were developed, especially as adapted for exposure to KrF excimer laser light. These compositions have not been used in the ArF excimer laser lithography because the phenolic units are not transmissive to exposure light having a wavelength of 150 to 220 nm. Recently, these compositions are recognized attractive again as the negative resist composition for the EB and EUV lithography capable of forming finer size patterns. Exemplary compositions are described in JP-A 2006-201532, JP-A 2006-215180, and JP-A 2008-249762.

In the course of development of resist compositions as mentioned above, the resist compositions are required to exhibit not only a high resolution which is the fundamental function of a resist film, but also high etch resistance. This is because the resist film must be thinned as the pattern feature size is reduced. One known means for achieving such high etch resistance is by introducing a polycyclic compound containing aromatic ring and non-aromatic ring wherein the non-aromatic ring has a carbon-carbon double bond conjugated to the aromatic ring, like indene or acenaphthylene, into a hydroxystyrene-based polymer as an auxiliary component. This is disclosed in JP-A 2008-249762.

Also in the course of development of resist compositions as mentioned above, improvements have been made in individual components for ameliorating the resist performance. With respect to the basic compound for holding down acid diffusion, a number of improvements have been reported. For use in resist compositions adapted for the ArF immersion lithography involving formation of a water layer on a resist film and exposure to ArF excimer laser radiation, for example, a polymer having a basic compound bound thereto is proposed in JP-A 2008-133312. This polymer is effective for preventing the basic compound from migrating and diffusing to a water phase in contact with the resist film to alter the resolution of a resist surface region.

Another known example of the polymer having a nitrogen-containing partial structure is disclosed in JP-A 2009-86310. A polymer having a hetero-ring is used in resist compositions, though not for the purpose of holding down acid diffusion.

CITATION LIST

Patent Document 1: JP-A 2006-201532 (US 20060166133, EP 1684118, CN 1825206)
Patent Document 2: JP-A 2006-215180
Patent Document 3: JP-A 2008-249762 (US 2008241751, EP 1975711, CN 101387831)
Patent Document 4: JP-A 2008-133312
Patent Document 5: JP-A 2009-86310 (US 2009087789, EP 2042925)
Patent Document 6: JP-A 2009-263487 (US 2009269696, EP 2112554)
Patent Document 7: JP-A 2008-102383 (US 2008096128)

DISCLOSURE OF INVENTION

To meet the increasing demand for a pattern of finer feature size, efforts have been made to improve the negative resist composition of the ordinary type using a basic compound. As the pattern feature size is reduced to a very fine size of 0.1 µm or less, some problems become more outstanding, for example, a bridge problem that a resist layer in thin thread form is left between pattern features, and a reduced line edge roughness (LER). The conventional resist compositions fail to overcome these problems.

The phenomenon that the material of a processable substrate causes a resist pattern to change its profile near the substrate is known as the "substrate poisoning" problem, which becomes more serious. Even a small profile change becomes significant as the feature size of the desired pattern is reduced. This is true particularly when a photomask blank having a chromium oxynitride layer as the outermost surface is processed. A chemically amplified negative resist composition is coated on the chromium oxynitride layer of the photomask blank to form a resist film, which is patterned. During the process, the resist pattern is notched at its contact with the substrate, which is known as the "undercut" problem. The undercut problem is not fully overcome by conventional resist compositions.

An object of the invention is to provide a chemically amplified negative resist composition adapted to be processed by EB or EUV lithography to form a pattern featuring reduced LER and minimized substrate poisoning, and a patterning process using the same.

The invention pertains to a chemically amplified negative resist composition adapted for use in the EB or EUV lithography rather than the immersion lithography wherein the surface of resist film contacts with water or fluid as described in Patent Document 4. The inventors have found that when a polymer having a secondary or tertiary amine structure on a side chain is used as a basic compound in the resist composition, it contributes to reductions of LER and substrate poisoning.

In one aspect, the invention provides a chemically amplified negative resist composition for EB or EUV lithography, comprising (A) an alkali-soluble polymer, (B) an acid generator capable of generating an acid catalyst, and (C) a nitrogen-containing compound as a basic component, the polymer as component (A) turning alkali insoluble under the action of the acid catalyst in the presence or absence of a crosslinker. A basic polymer PB comprising recurring units of the general formulae (1) and (2) and having a weight average molecular weight of 1,000 to 50,000 serves as both components (A) and (C).

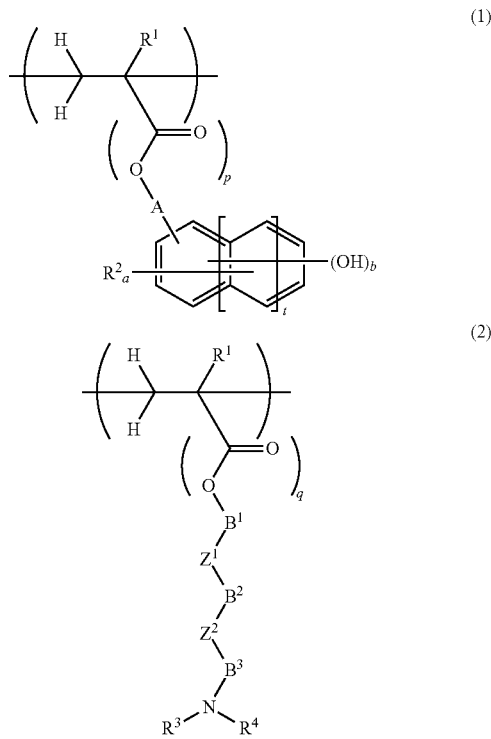

Herein A is a single bond or a $C_1$-$C_{10}$ alkylene group which may be separated by an ethereal oxygen atom; $R^1$ is each independently hydrogen or methyl; $R^2$ is each independently a $C_1$-$C_6$ alkyl group; $B^1$, $B^2$, and $B^3$ are each independently a single bond, or a linkage selected from the group consisting of a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing; $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—; $R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring; $B^3$ may bond with $R^3$ or $R^4$ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring; a is an integer of 0 to 4, b is a positive integer of 1 to 5, p and q are each independently 0 or 1, t is an integer of 0 to 2, with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group.

In a preferred embodiment, the basic polymer PB further comprises units of the general formula (3).

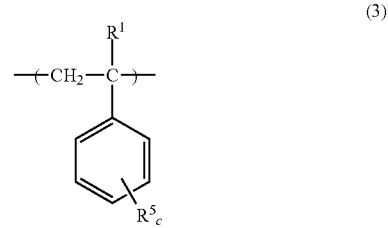

Herein $R^1$ is as defined above, $R^5$ is a halogen atom, optionally halo-substituted $C_1$-$C_6$ alkyl or alkoxy group, optionally halo-substituted $C_2$-$C_7$ alkoxycarbonyl group, alicyclic group, aromatic group, or optionally halo-substituted $C_2$-$C_7$ acyloxy group, and c is an integer of 0 to 5.

In a preferred embodiment, the basic polymer PB further comprises units of the general formula (4) and/or (5).

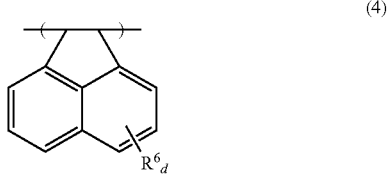

Herein d is an integer of 0 to 4, and $R^6$ is each independently a hydroxyl group, halogen atom, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group.

In a preferred embodiment, the resist composition may further comprise a polymer free of recurring units of formula (2) as part of component (A).

In a preferred embodiment, the resist composition may further comprise a basic compound having a molecular weight of up to 1,000 as part of component (C), the basic compound being present in an amount of up to 1/20 mole per mole of the acid generator (B).

In a preferred embodiment, the resist composition may further comprise a crosslinker which reacts with component (A) in the presence of the acid catalyst for turning component (A) alkali insoluble.

In a preferred embodiment, the resist composition may further comprise a polymer comprising recurring units of the general formula M-1 or M-2 as component (A), wherein the resist composition is free of a crosslinker.

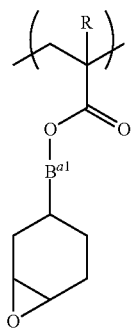

M-1

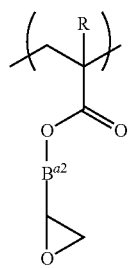

M-2

Herein R is hydrogen or methyl, $B^{a1}$ is a single bond or a $C_1$-$C_{10}$ alkylene group which may be separated by an ether bond, $B^{a2}$ is a $C_2$-$C_{10}$ alkylene group which may be separated by an ether bond, with the proviso that when $B^{a1}$ and $B^{a2}$ contain an ether bond, the ether bond is at a remoter position than β-position relative to the ester oxygen.

In another aspect, the invention provides a pattern forming process comprising the steps of applying the negative resist composition defined above onto a processable substrate to form a resist film, exposing the film patternwise to EB or EUV radiation, and developing the exposed film with an alkaline developer to form a resist pattern.

In a preferred embodiment, the processable substrate comprises a chromium-containing material at the outermost surface. Typically, the processable substrate is a photomask blank.

Advantageous Effects of Invention

When a chemically amplified negative resist composition comprising a basic polymer as defined herein is used in a EB or EUV lithography process of forming a resist pattern which is required to have an ultrafine size, the microscopic distribution and dispersion of the basic compound in the resist film are more uniform. This achieves an improvement in LER, inhibits deactivation of acid at the substrate interface, and enables to form a resist profile which is reduced in the degree of undercut inherent to negative resist film.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The terminology "($C_x$-$C_y$)", as applied to a particular unit, such as, for example, a chemical compound or a chemical substituent group, means having a carbon atom content of from "x" carbon atoms to "y" carbon atoms per such unit.

The acronym LER stands for line edge roughness, PEB for post-exposure bake, and PAG for photoacid generator.

A chemically amplified negative resist composition for EB or EUV lithography is defined herein as comprising (A) an alkali-soluble polymer, (B) an acid generator capable of generating an acid catalyst, (C) a nitrogen-containing compound as a basic component, and optionally, a crosslinker. The polymer (A) turns alkali insoluble under the action of the acid catalyst in the presence or absence of a crosslinker. A basic polymer PB comprising recurring units of the general formulae (1) and (2) serves as both components (A) and (C).

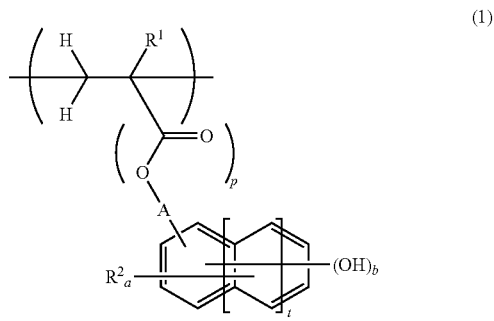

(1)

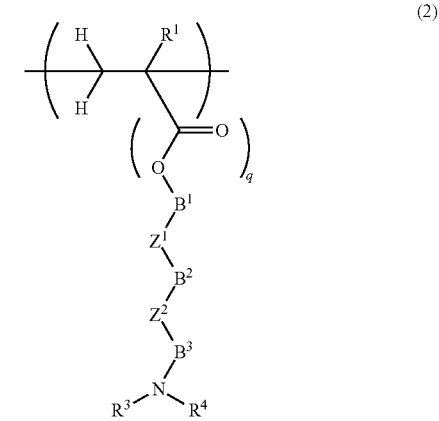

(2)

Herein A is a single bond or a $C_1$-$C_{10}$ alkylene group which may be separated by an ethereal oxygen atom. $R^1$ is each independently hydrogen or methyl. $R^2$ is each independently a $C_1$-$C_6$ alkyl group. $B^1$, $B^2$, and $B^3$ are each independently a single bond, or a linkage selected from the group consisting of a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing. $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—. $R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time. $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring. $B^3$ may bond with $R^3$ or $R^4$ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring. The subscript "a" is an integer of 0 to 4, "b" is a positive integer of 1 to 5, p and q are each independently 0 or 1, t is an integer of 0 to 2, with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group. Understandably, the phrase that an alkylene group may be separated by an ethereal oxygen atom, for example, means that an ethereal oxygen atom may intervene at any intermediate position of the alkylene chain.

The recurring units of formula (1) contribute to etch resistance, adhesion to a substrate, and dissolution in an alkaline developer. These recurring units are already found in many resist compositions for the KrF excimer laser lithography and EB lithography including the patent documents cited above.

In formula (1), A is a single bond or a $C_1$-$C_{10}$ alkylene group which may be separated by an ethereal oxygen atom (or ether bond). Preferred examples of the alkylene group include methylene, ethylene, propylene, butylene, pentylene, hexylene, and structural isomers of a carbon skeleton having branched or cyclic structure. For the alkylene group containing an ethereal oxygen atom, where p in formula (1) is 1, the ethereal oxygen atom may be incorporated at any position excluding the position between the α- and β-carbons relative to the ester oxygen. Where p is 0, the atom in A that bonds with the main chain becomes an ethereal oxygen atom, and a second ethereal oxygen atom may be incorporated at any position excluding the position between the α- and β-carbons relative to that ethereal oxygen atom. Alkylene groups having more than 10 carbon atoms are undesirable because of a low solubility in alkaline developer.

$R^2$ is each independently a $C_1$-$C_6$ alkyl group. Preferred examples of the alkyl group include methyl, ethyl, propyl, isopropyl, butyl, pentyl, hexyl, and structural isomers of a carbon skeleton having branched or cyclic structure. Alkyl groups having more than 6 carbon atoms are undesirable because of a low solubility in alkaline developer.

The subscript "a" is an integer of 0 to 4, and "b" is a positive integer of 1 to 5. Preferably, a is an integer of 0 to 3 and b is an integer of 1 to 3 when t is 0. Also preferably, a is an integer of 0 to 4 and b is an integer of 1 to 5 when t is 1 or 2. The subscript t is an integer of 0 to 2. The structure represents a benzene skeleton when t=0, a naphthalene skeleton when t=1, and an anthracene skeleton when t=2.

Of the recurring units of formula (1), those recurring units wherein p is 0 and A is a single bond (meaning that the aromatic ring is directly bonded to the main chain of the polymer), that is, linker-free recurring units are units derived from monomers in which an α-substituted or unsubstituted vinyl group is attached to a hydroxyl-substituted aromatic ring, as typified by hydroxystyrene units. Preferred examples include 3-hydroxystyrene, 4-hydroxystyrene, 5-hydroxy-2-vinylnaphthalene, and 6-hydroxy-2-vinylnaphthalene.

Those recurring units wherein p is 1, that is, recurring units having an ester structure as the linker are units of carbonyl-substituted vinyl monomers as typified by (meth)acrylates.

Preferred examples of the units of formula (1) having a linker (—CO—O-A-) derived from (meth)acrylates are shown below.

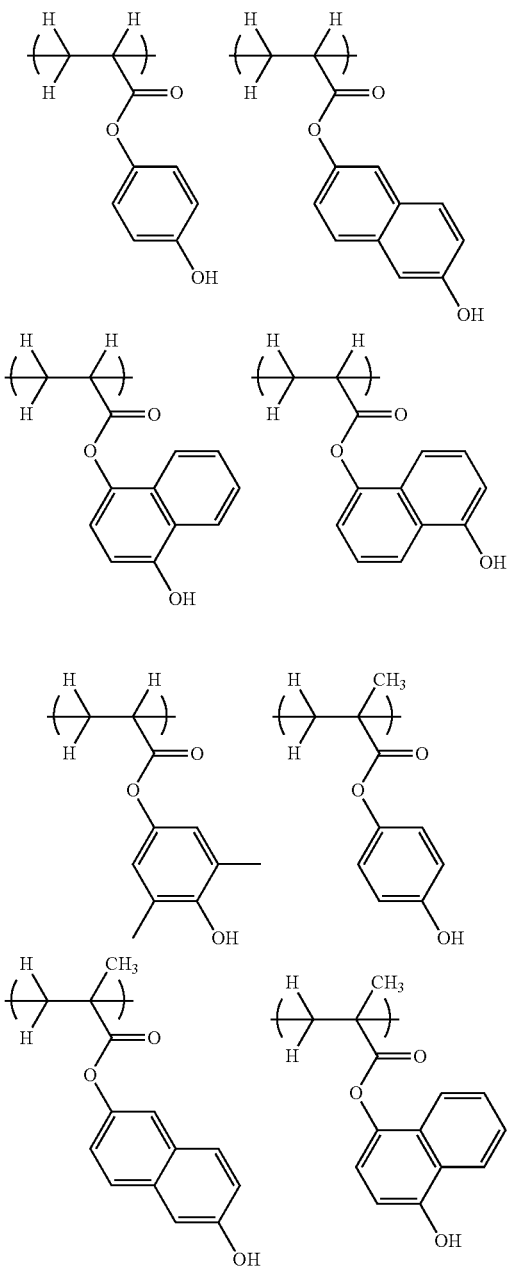

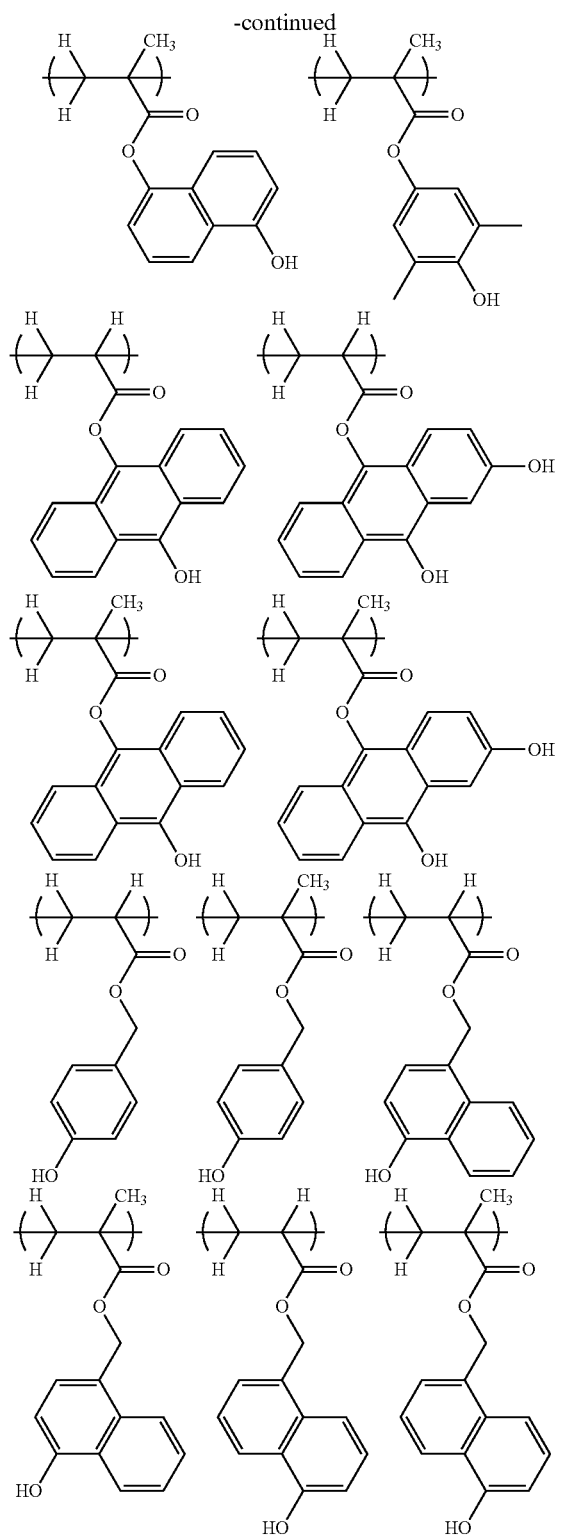

The recurring units of formula (2) are recurring units having a side chain containing a secondary amino group having two different carbons bonded thereto or a tertiary amino group having three different carbons bonded thereto as the basic active site. Now that $B^3$ is not a single bond when $Z^2$ is —O—CO—, the nitrogen atom represented by N in formula (2) does not become amidic nitrogen, and it has a strong proton-capture ability unlike nitrogen contained in pyridine or pyrrole ring. Whether or not the side chain of the recurring unit of formula (2) has an ester structure, the group represented by $B^1$, $B^2$ or $B^3$ in formula (2) contains as a partial structure a linkage having at least two single bonds (capable of free rotation) originating from an alkylene group of at least 2 carbon atoms or aromatic group, and therefore, the nitrogen atom has a sufficient thermal motion ability to capture a proton. Particularly when the side chain has an ester structure, or when the group represented by $B^1$, $B^2$ or $B^3$ in formula (2) contains as a partial structure at least 2 consecutive carbon atoms originating from an alkylene group, the nitrogen atom represented by N in formula (2) has a high thermal motion ability and hence, an advantageous acid capture ability. That is, the nitrogen atom represented by N in formula (2) has a sufficient thermal motion ability and an advantageous acid capture ability.

It is noted that Patent Document 5 describes a polymer possessing a heterocycle having a nitrogen atom originating from a pyrrole or pyridine ring or a nitrogen atom with a low degree of freedom at a relative position to the main chain. A basic compound is separately added to the resist composition according to Patent Document 5. The data in Examples do not demonstrate the tendency that a nitrogen-containing polymer has a lower sensitivity than a nitrogen-free polymer. It is understood that the nitrogen in the polymer described in Patent Document 5 has a low proton capture ability and serves a different function from the recurring units of formula (2) according to the invention.

In formula (2), $B^1$, $B^2$, and $B^3$ are each independently a single bond, or a linkage selected from among a straight or branched $C_1$-$C_{10}$ alkylene group which may contain an ethereal oxygen atom, a divalent alicyclic group which may be separated by an ethereal oxygen atom, a divalent $C_6$-$C_{14}$ aromatic group which may be separated by an ethereal oxygen atom, and combinations comprising one or more of the foregoing. $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—.

Preferred examples of the alkylene group represented by $B^1$, $B^2$ and $B^3$ include methylene, ethylene, propylene, butylene, pentylene, hexylene, and structural isomers thereof having branched structure. The alkylene group may contain an ethereal oxygen atom at an intermediate, and preferred examples thereof include, when expressed from the ester oxygen side, ethyleneoxymethylene, ethyleneoxyethylene, ethyleneoxy-1,2-propylene, ethyleneoxy-1,3-propylene, 1,2-propyleneoxymethylene, 1,2-propyleneoxyethylene, 1,2-propyleneoxy-1,2-propylene, 1,2-propyleneoxy-1,3-propylene, 1,3-propyleneoxymethylene, 1,3-propyleneoxyethylene, 1,3-propyleneoxy-1,2-propylene, and 1,3-propyleneoxy-1,3-propylene. Preferred examples of the alicyclic group include 1,3-cyclopentylene, 1,4-cyclohexylene, 2,3-norbornylene, 2,5-norbornylene, 2,6-norbornylene, and 1,3-adamantylene. Preferred examples of the aromatic group include 1,3-phenylene, 1,4-phenylene, 1,4-naphthylene, 1,5-naphthylene, and 2,6-naphthylene.

$B^1$, $B^2$ and $B^3$ may be selected from the foregoing groups, alone or in combination of two or more such that the number of carbon atoms does not exceed 14, preferably 10. A carbon count in excess of 14 is undesirable because of a low solubility in alkaline developer.

In formula (2), q is 0 or 1. In case of q=0, the atom in $B^1$ that bonds with a main chain carbon is an ethereal oxygen atom or a carbon atom forming an aromatic ring. Then, upon polymerization, a monomer from which recurring units (2) are derived is readily copolymerizable with a monomer from which other recurring units are derived. In case of q=1, the units of formula (2) are recurring units derived from (meth)acrylate. Where q=0 and $Z^1$ and $Z^2$ are single bonds, one or more of $B^1$, $B^2$, and $B^3$ should contain at least two consecutive carbon atoms originating from an alkylene group, or an aromatic group.

$R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time. Alternatively, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring. Suitable hydrocarbon groups include methyl, ethyl, propyl, isopropyl, butyl and isobutyl. Suitable hydrocarbon groups containing an ether bond include 2-methoxyethyl, 2-ethoxyethyl, 2-propoxyethyl, 2-isopropoxyethyl, 2-methoxypropyl, 2-ethoxypropyl, 2-propoxypropyl, 2-isopropoxypropyl, 3-methoxypropyl, 3-ethoxypropyl, and 3-propoxypropyl. When $R^3$ and $R^4$ taken together form a ring, a 5 or 6-membered ring is preferred. Suitable heteroatoms include oxygen, nitrogen and sulfur, with oxygen being preferred.

$B^3$ may bond with $R^3$ or $R^4$ to form a ring with the nitrogen atom to which they are attached. In this case, the nitrogen-containing ring is a 5 to 7-membered ring, preferably 5 or 6-membered ring. Where $B^3$ bonds with $R^3$ or $R^4$ to form a ring with the nitrogen atom to which they are attached, the nitrogen-containing ring is not a ring of the structure that a lone pair of the nitrogen atom represented by N in formula (2) renders the nitrogen-containing ring aromatic, and the nitrogen-containing ring is not an aromatic ring. Exemplary rings of the structure to be excluded herein are pyrrole and pyridine rings.

Preferred examples of the recurring units derived from (meth)acrylates, that is, recurring units of formula (2) wherein q is 1, $B^2$ and $B^2$ are single bonds, $Z^1$ and $Z^2$ are single bonds, and $B^3$ is alkylene are given below. Note that $R^1$ is as defined above, and Me stands for methyl.

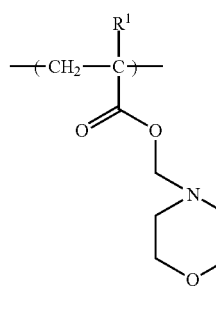
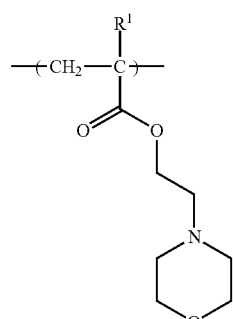
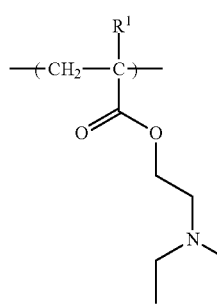
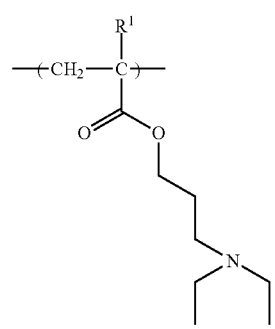

-continued

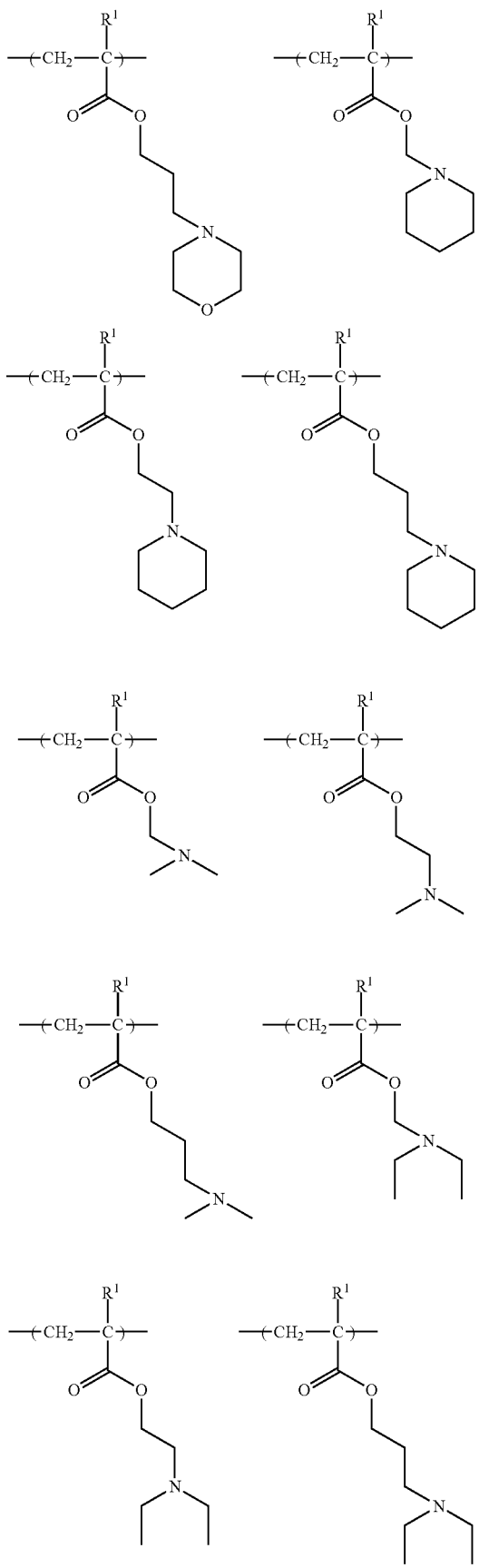

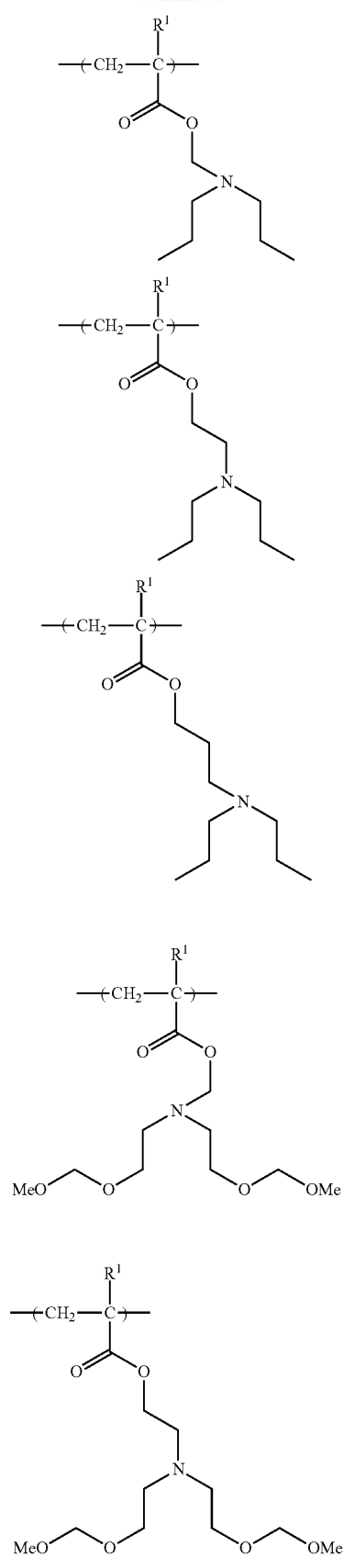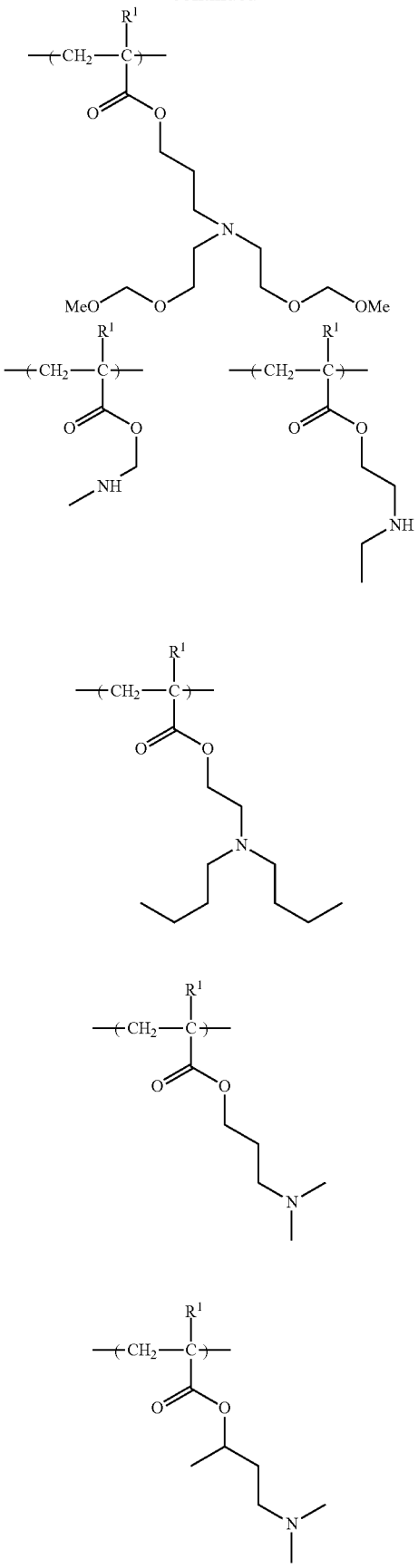

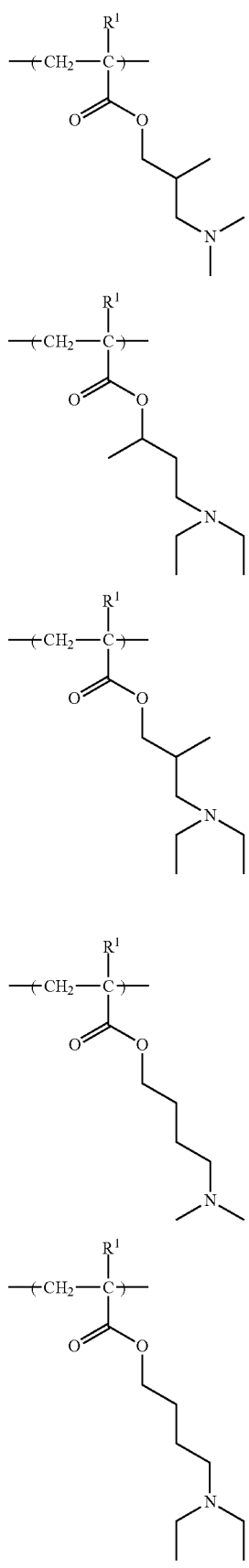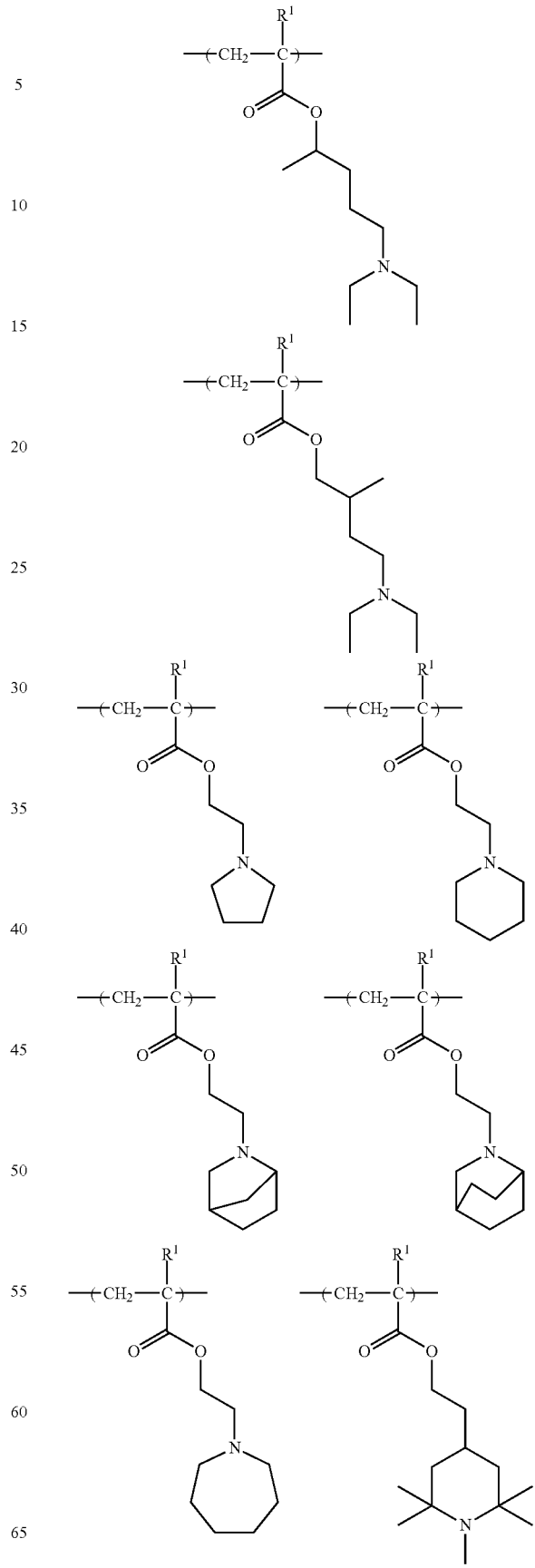

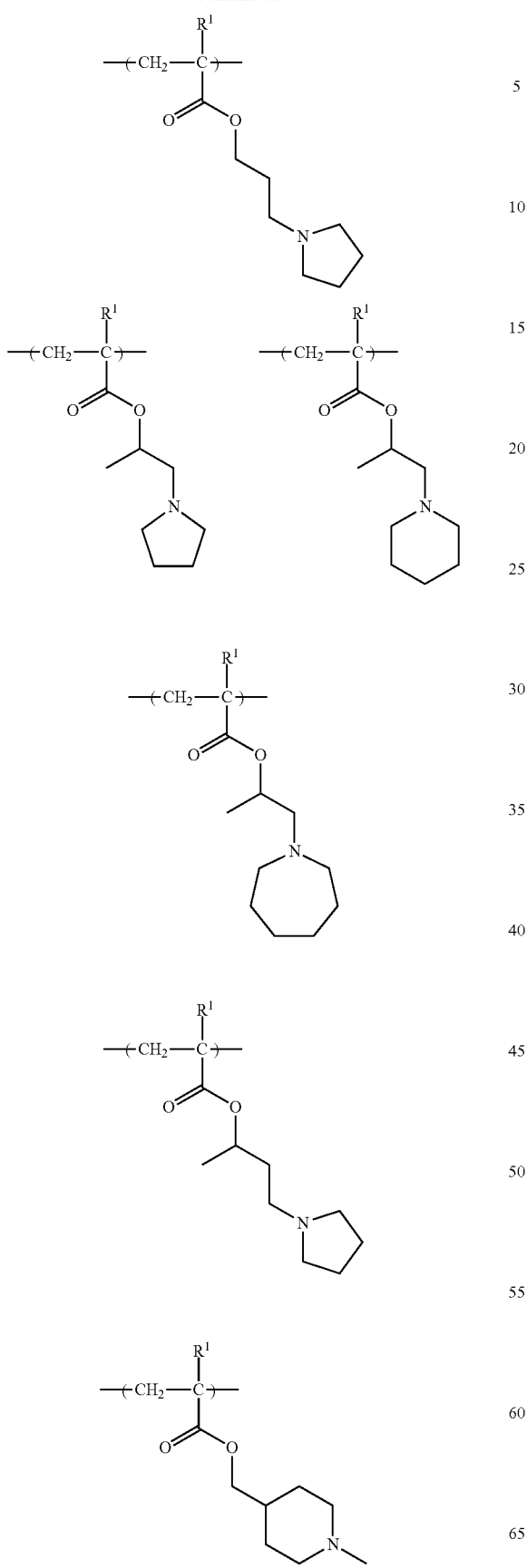
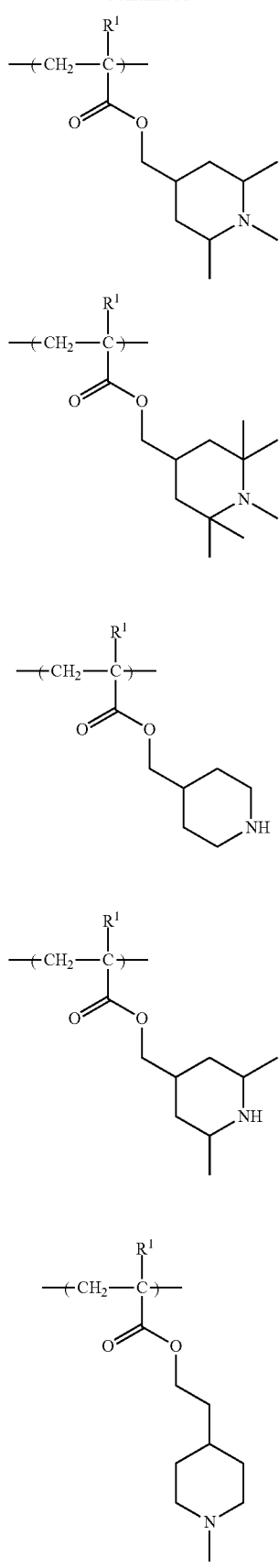

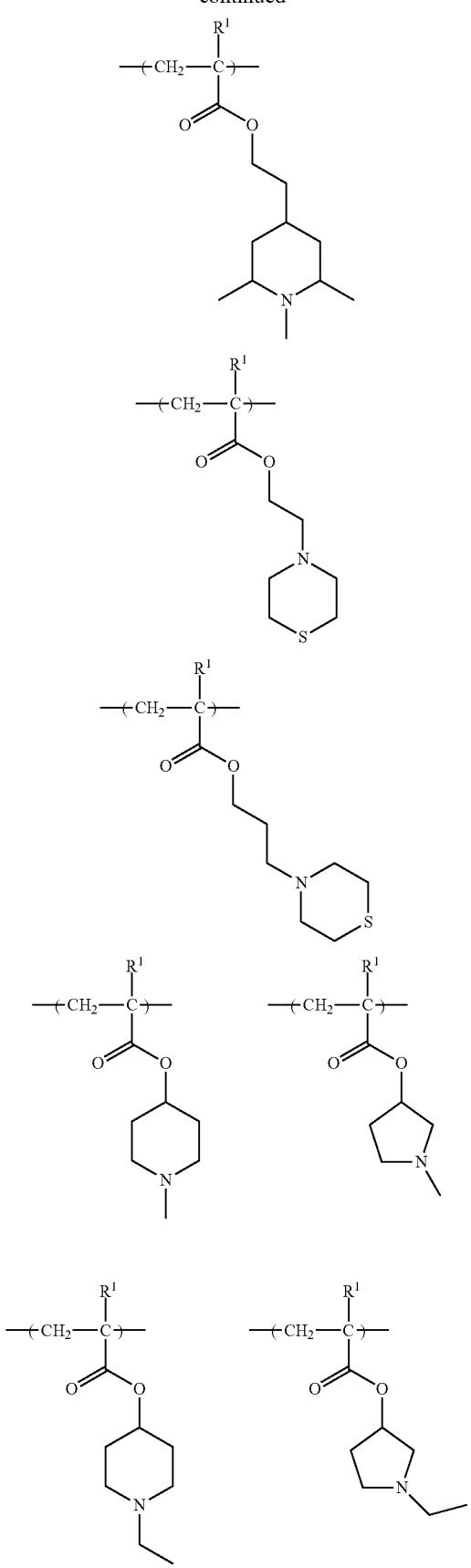
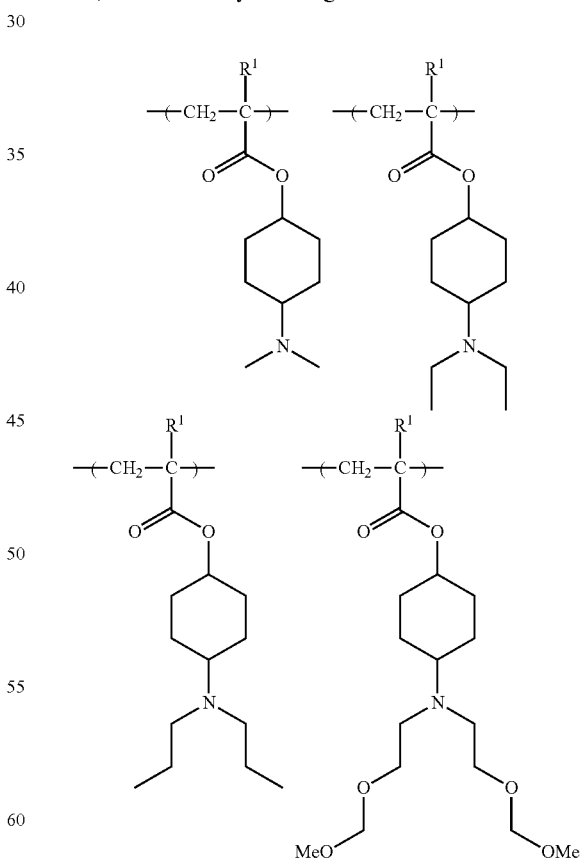
Preferred examples of the recurring units of formula (2) wherein q is 1, $B^1$ and $B^2$ are single bonds, $Z^1$ and $Z^2$ are single bonds, and $B^3$ is alicyclic are given below.
Preferred examples of the recurring units of formula (2) wherein q is 1, $B^1$ and $B^2$ are single bonds, $Z^3$ and $Z^2$ are single bonds, and $B^3$ is ethereal oxygen-containing alkylene are given below.

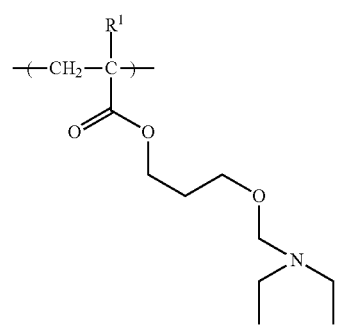
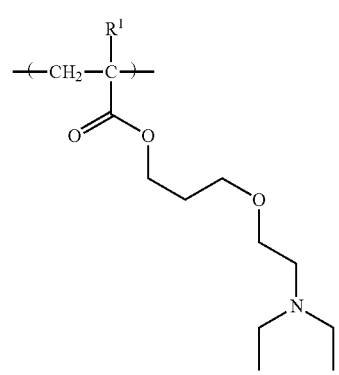
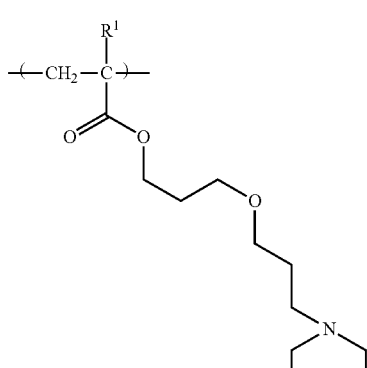
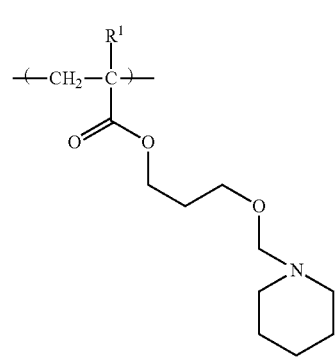
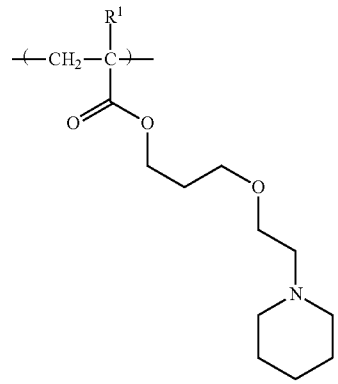
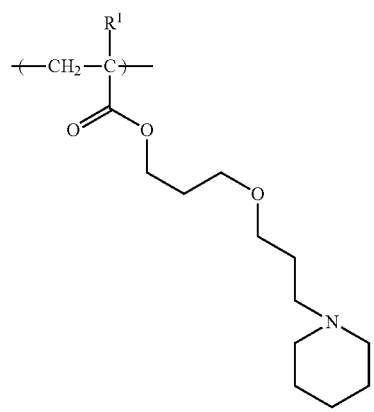
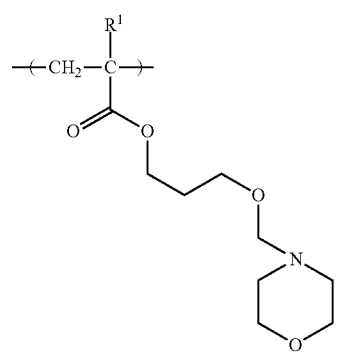
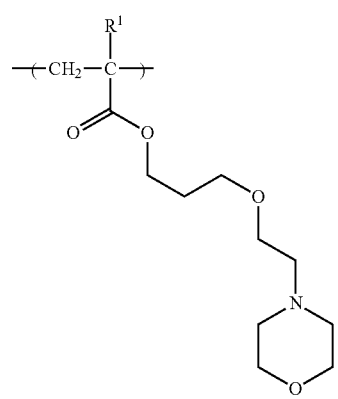

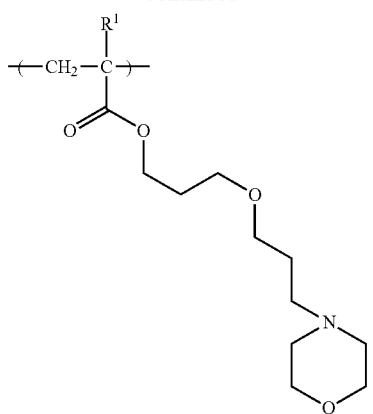
Preferred examples of the recurring units of formula (2) wherein q is 1, $B^1$ and $B^2$ are single bonds, $Z^1$ and $Z^2$ are single bonds, and $B^3$ is aromatic are given below.
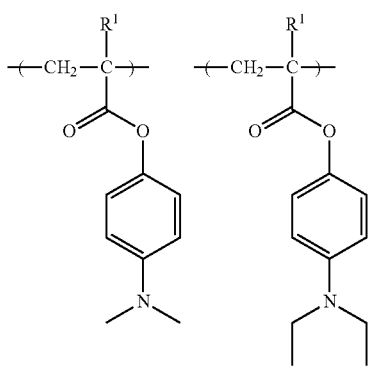
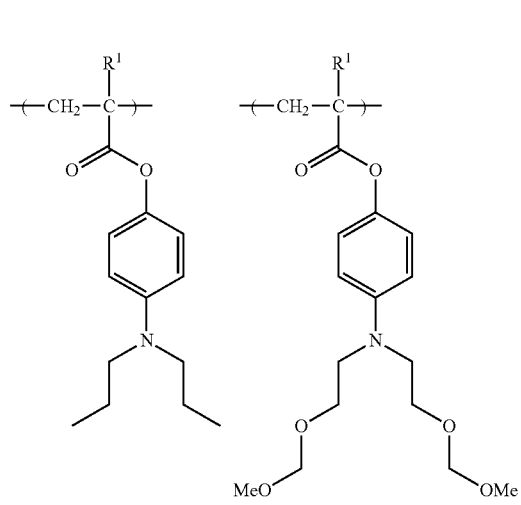
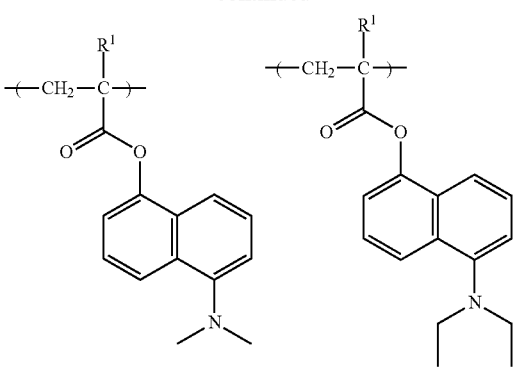
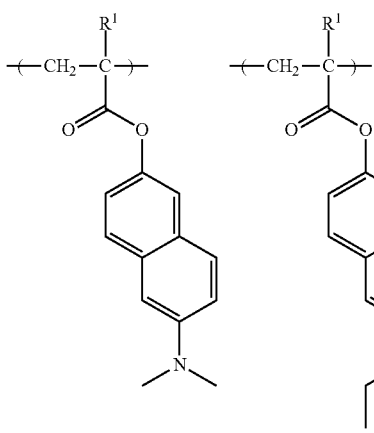
Preferred examples of the recurring units of formula (2) wherein q is 1, $B^1$ is a single bond, $Z^1$ is a single bond, $B^2$ is alicyclic, $Z^2$ is —O—CO— or —CO—O—, and $B^3$ is alkylene are given below.
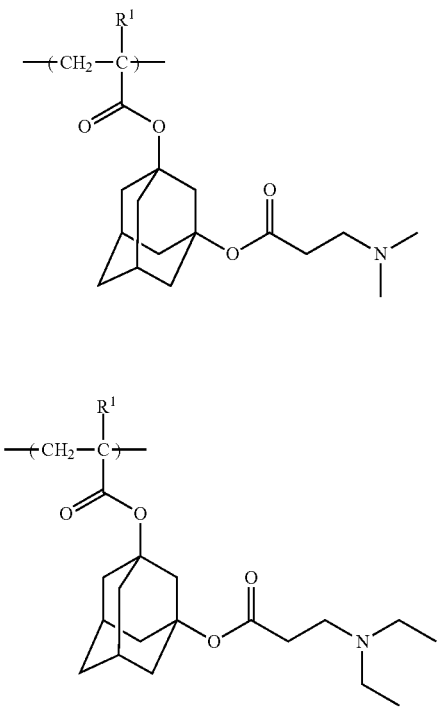

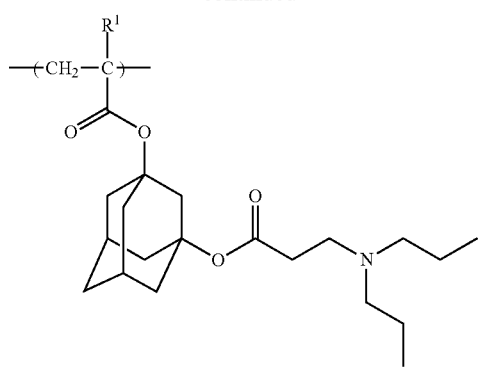
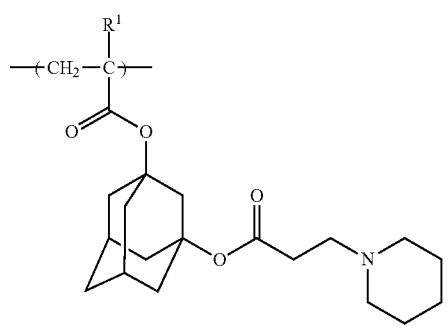
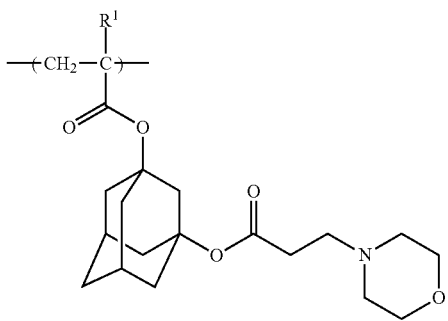
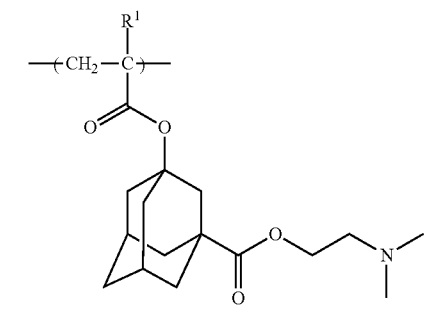
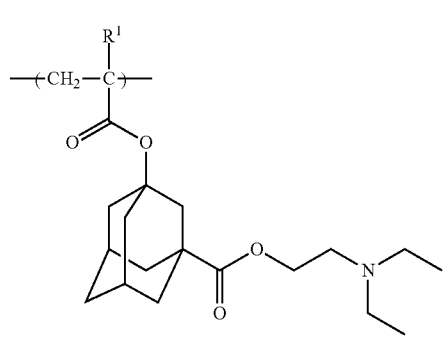
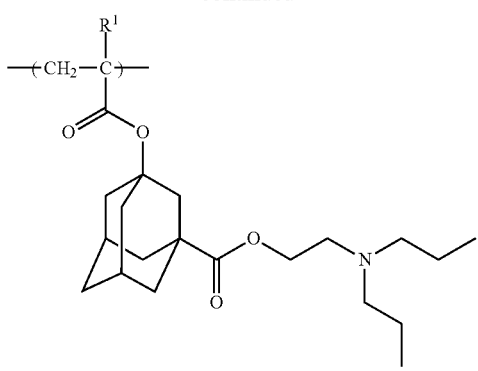
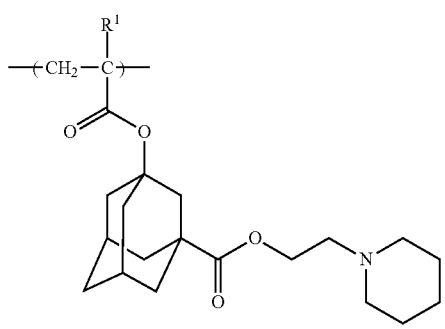
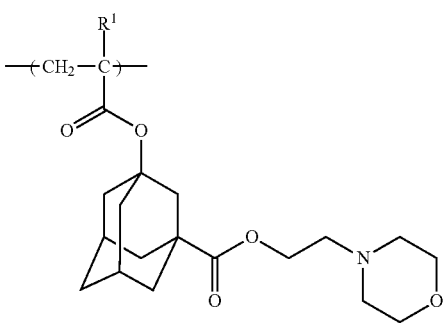
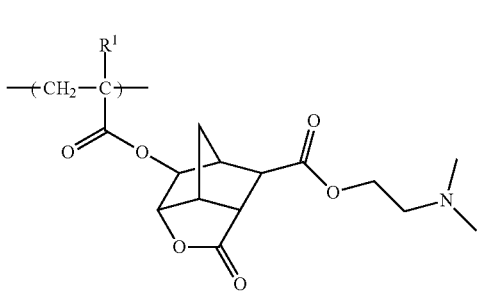
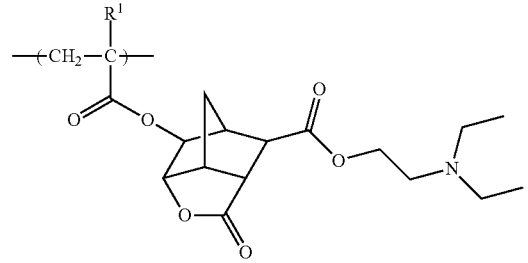

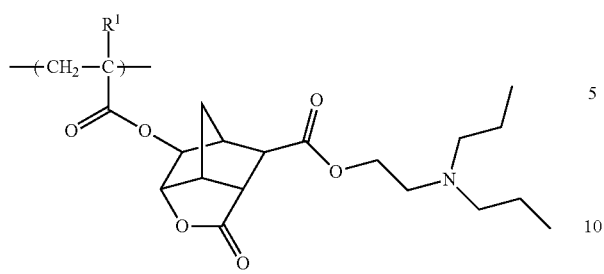

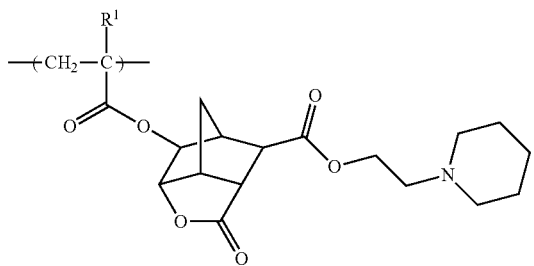

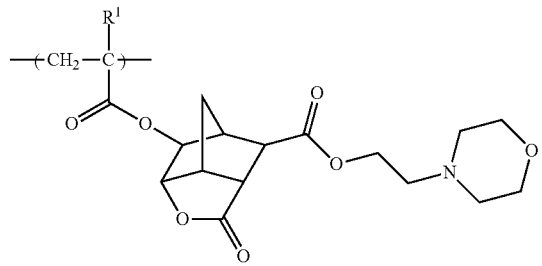

Preferred examples of the recurring units of formula (2) wherein q is 1, $B^1$ is a single bond, $Z^1$ is a single bond, $B^2$ is alkylene, $Z^2$ is —CO—O—, and $B^3$ is alkylene are given below.

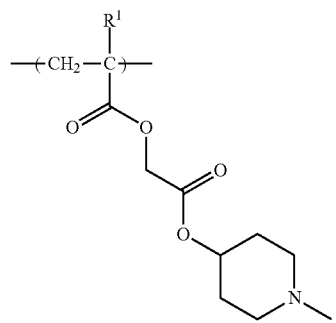

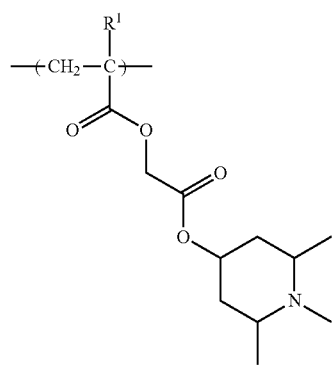

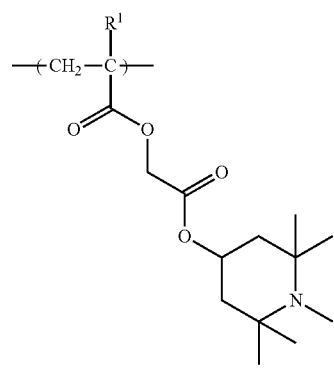

Preferred examples of the recurring units of formula (2) wherein q is 0, $B^1$ is a single bond, $Z^1$ is a single bond, $B^2$ is aromatic, $Z^2$ is a single bond, and $B^3$ is a single bond, alkylene or ethereal oxygen-containing alkylene are given below.

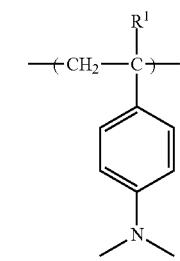 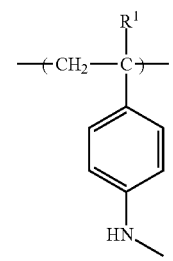

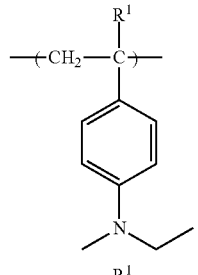 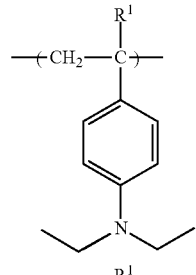

-continued
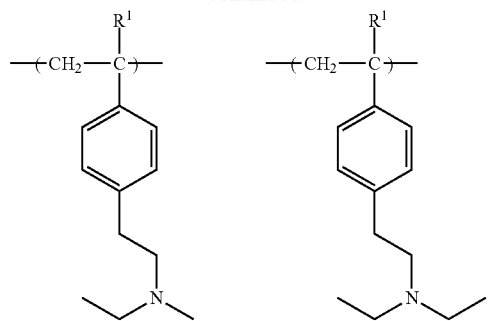
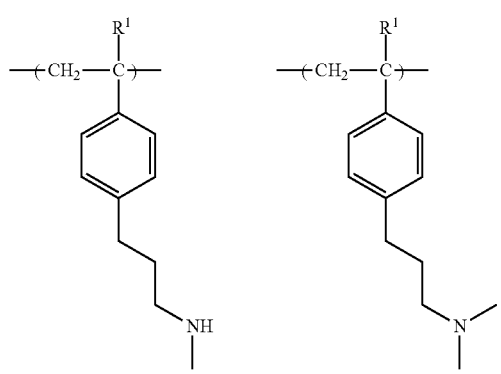
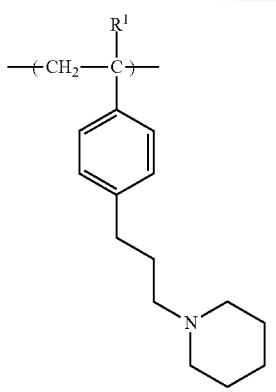 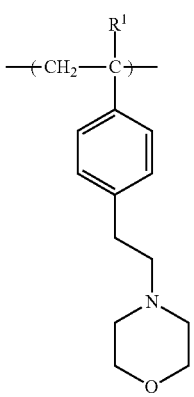
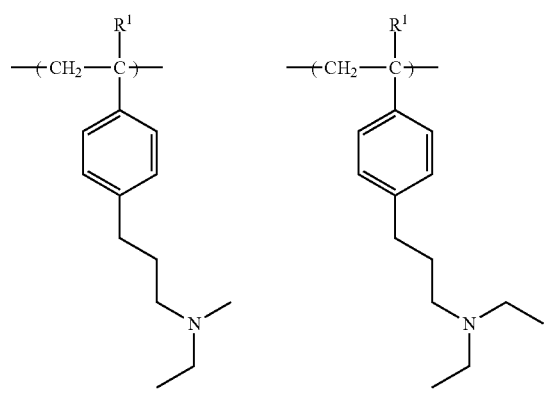 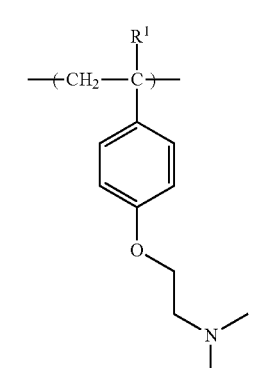
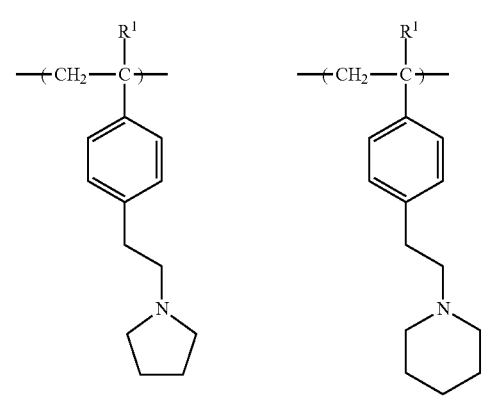 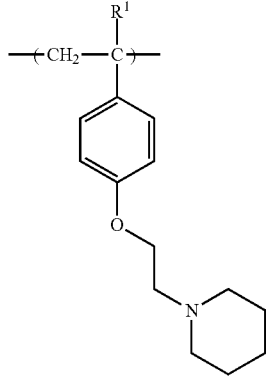

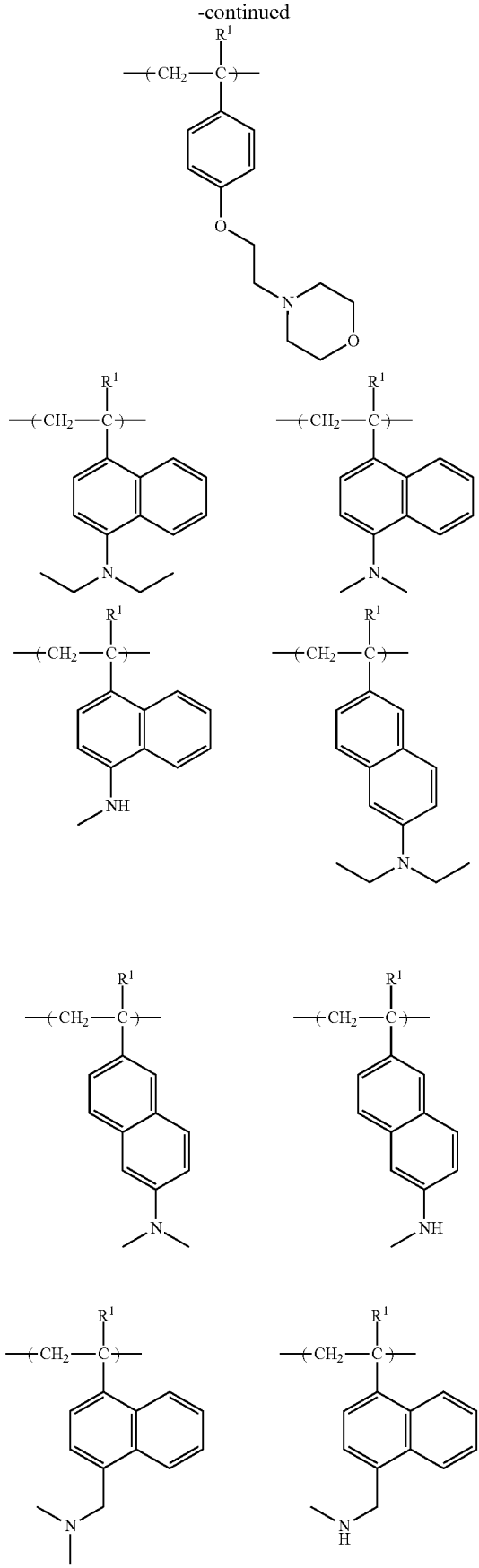
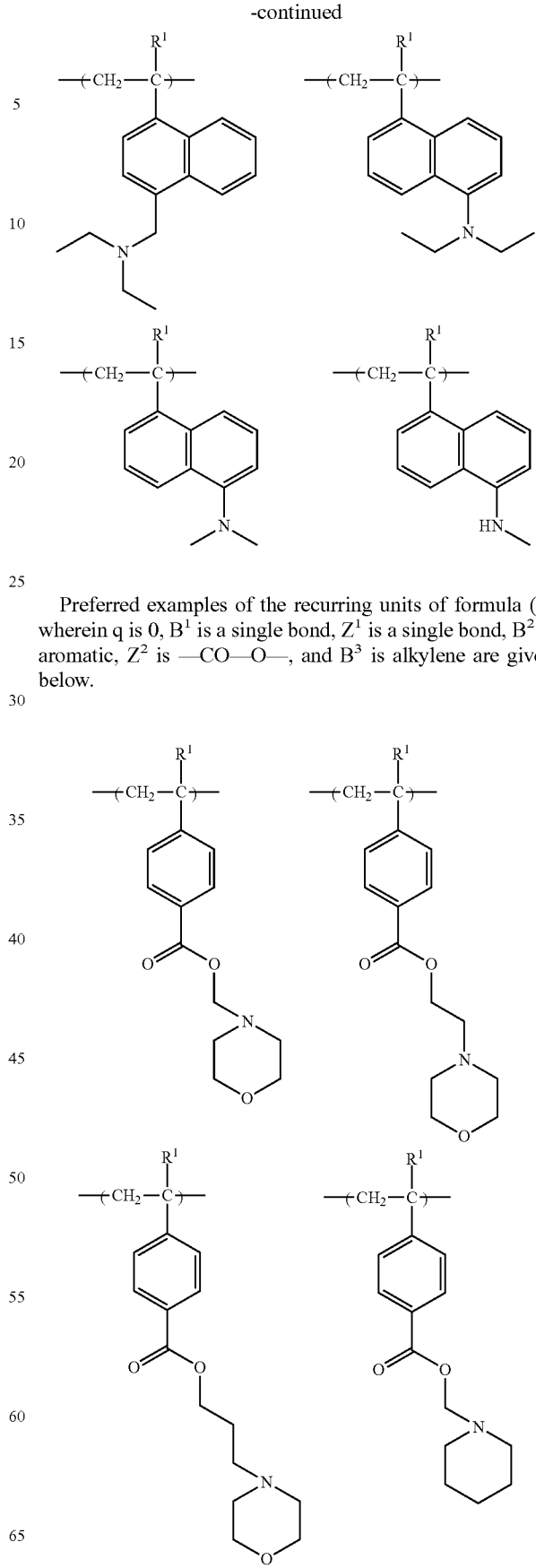
Preferred examples of the recurring units of formula (2) wherein q is 0, $B^1$ is a single bond, $Z^1$ is a single bond, $B^2$ is aromatic, $Z^2$ is —CO—O—, and $B^3$ is alkylene are given below.

33
-continued
34
-continued
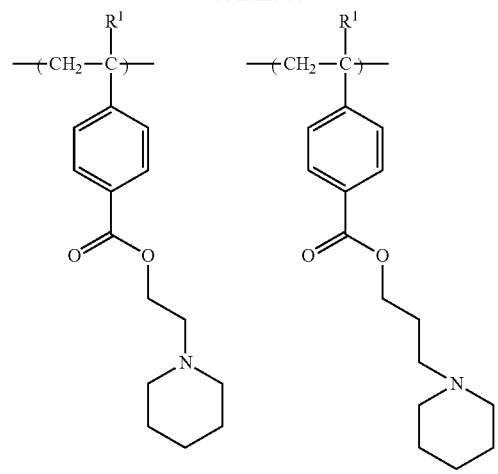
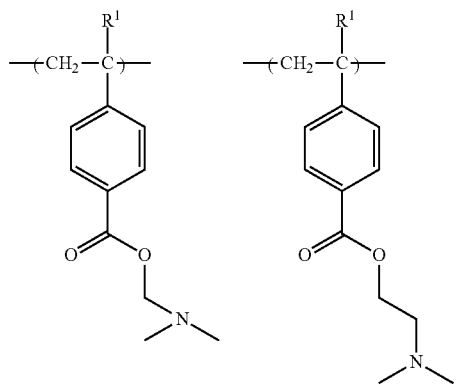
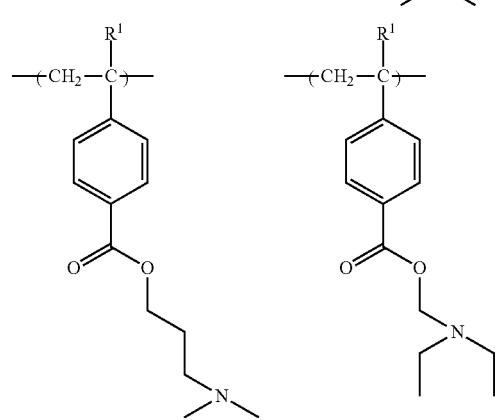
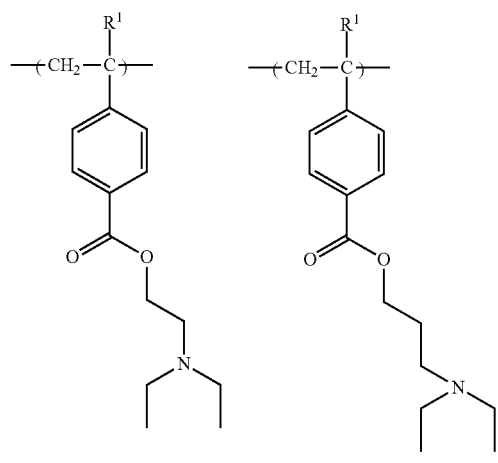
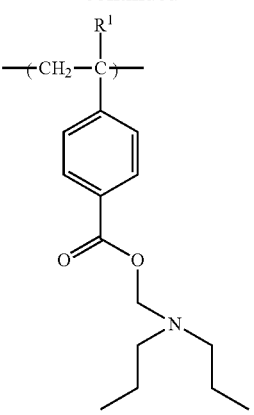
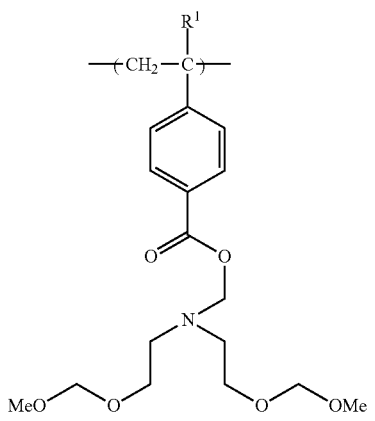

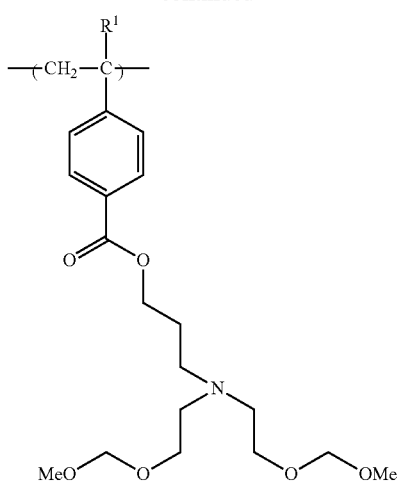
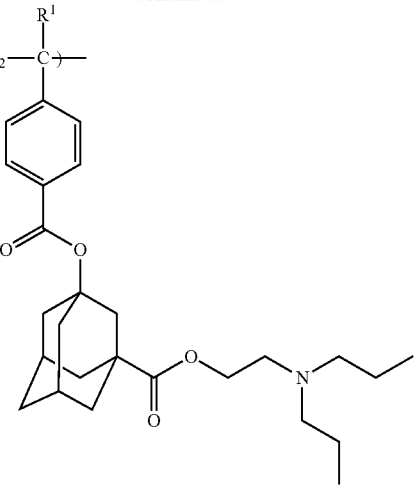
Preferred examples of the recurring units of formula (2) wherein q is 0, $B^1$ is aromatic, $Z^1$ is —CO—O—, $B^2$ is alicyclic, $Z^2$ is —CO—O— or —O—CO—, and $B^3$ is alkylene are given below.
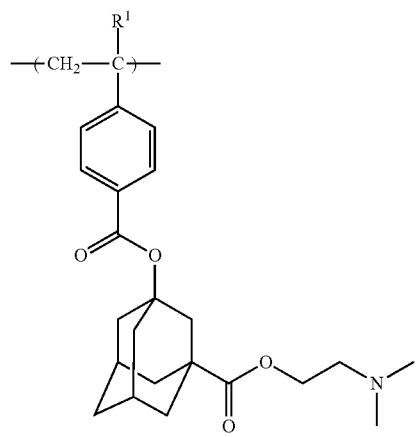
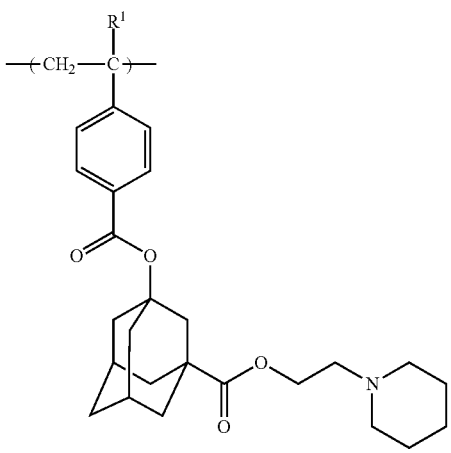
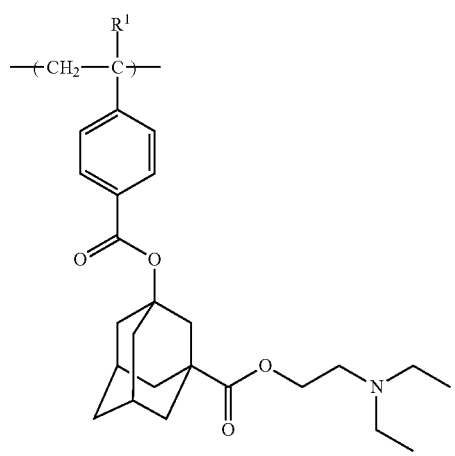
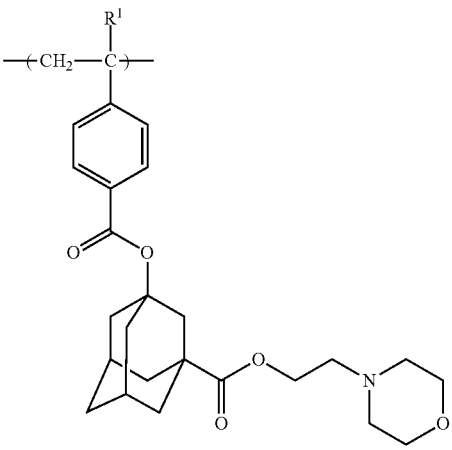

37
-continued
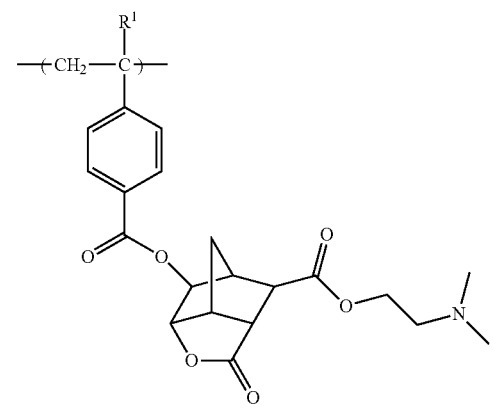
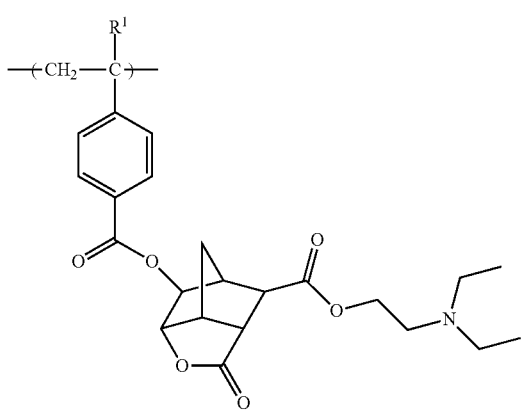
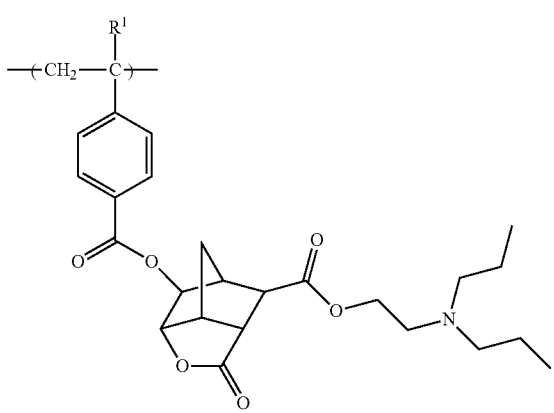
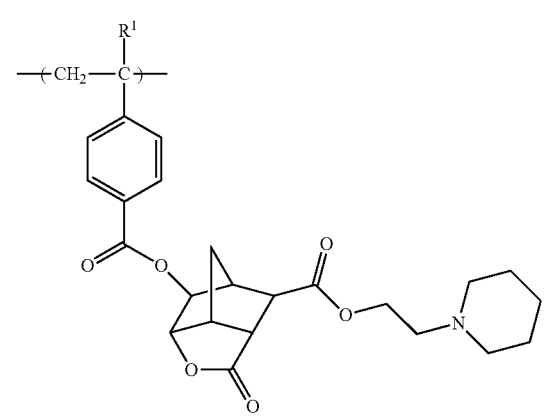
38
-continued
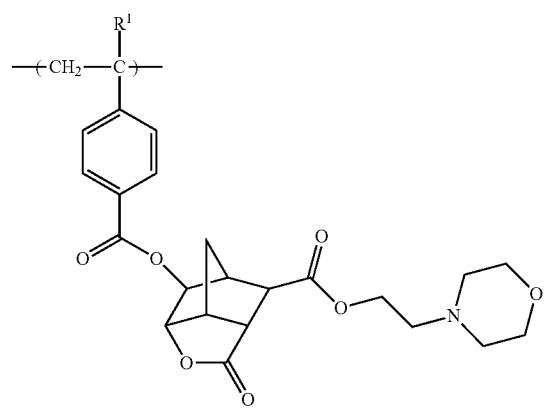
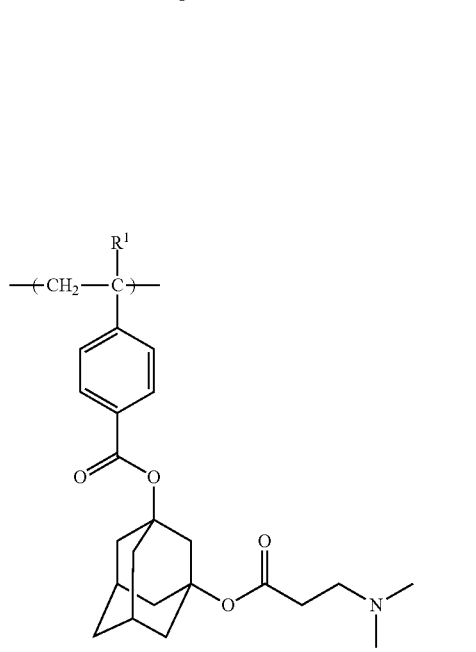
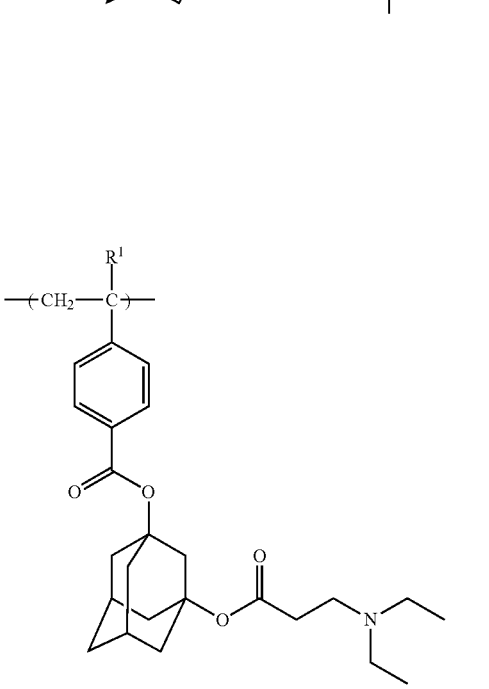

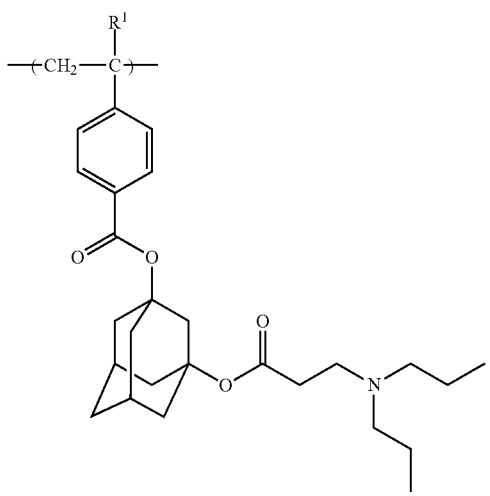

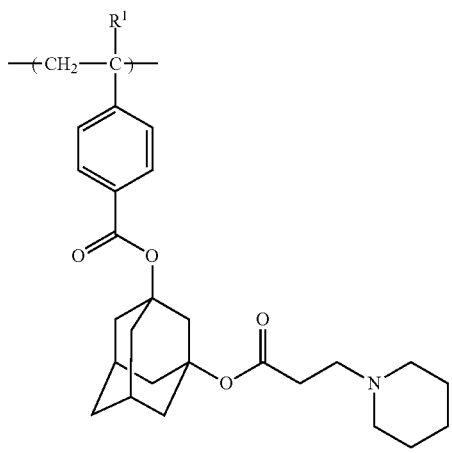

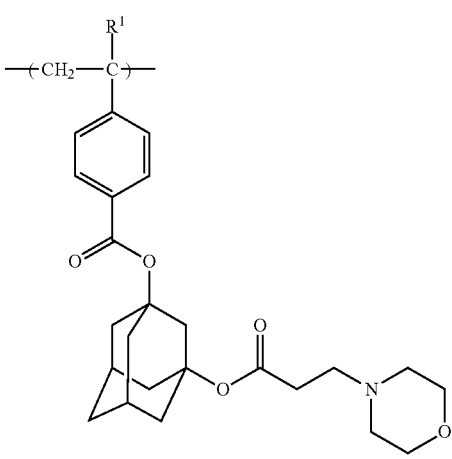

Preferred examples of the recurring units of formula (2) wherein q is 0, $B^1$ and $B^2$ are single bonds, $Z^1$ and $Z^2$ are single bonds, and $B^3$ is ethereal oxygen-containing alkylene are given below.

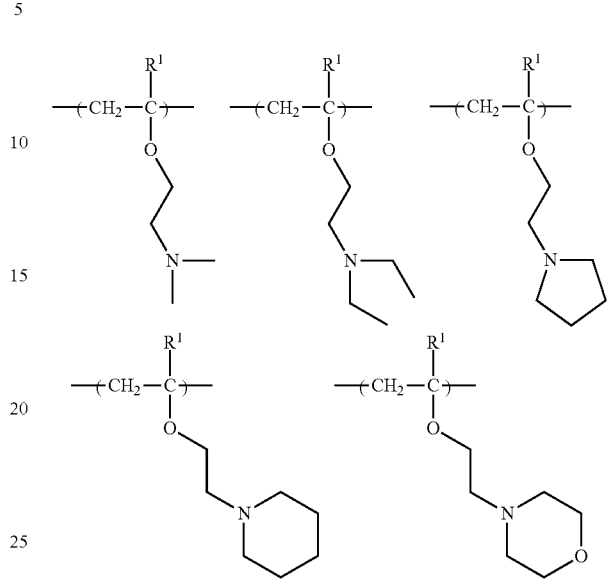

The polymer PB used in the resist composition may further comprise units of the following general formula (3) as main constituent units.

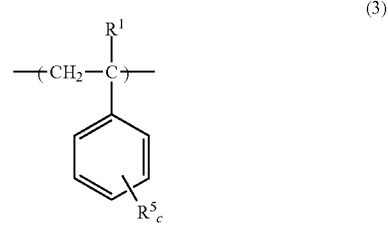

(3)

Herein $R^1$ is as defined above, $R^5$ is a halogen atom, optionally halo-substituted $C_1$-$C_6$ alkyl or alkoxy group, optionally halo-substituted $C_2$-$C_7$ alkoxycarbonyl group, alicyclic group, aromatic group, or optionally halo-substituted $C_2$-$C_7$ acyloxy group, and c is an integer of 0 to 5.

For group $R^5$, exemplary halogen atoms include fluorine, chlorine and bromine. The alkoxy group and alkoxy moiety of alkoxycarbonyl group are preferably of 1 to 6 carbon atoms, more preferably 1 to 4 carbon atoms, and examples include methoxy and isopropoxy. Optionally substituted alkyl groups include straight or branched alkyl groups such as methyl, ethyl, propyl, isopropyl, butyl, tert-butyl, pentyl, hexyl, and octyl, and substituted form of the foregoing alkyl groups in which one or more hydrogen atoms are substituted by halogen atoms or the like. Suitable acyloxy groups include methylcarbonyloxy, ethylcarbonyloxy, propylcarbonyloxy, butylcarbonyloxy, pentylcarbonyloxy, hexylcarbonyloxy and structural isomers thereof, cyclopentylcarbonyloxy, cyclohexylcarbonyloxy, benzoyloxy, and substituted form of the foregoing groups in which some hydrogen atoms are substituted by halogen atoms. Suitable alicyclic groups include cyclopentyl, cyclohexyl, and adamantyl. Suitable aromatic groups include unsubstituted phenyl and halo or alkoxy-substituted phenyl. Where these groups are substituted with halogen atoms, the preferred substituents are chlorine and fluorine.

When units of formula (3) are used as constituent units in polymer PB, they contribute to the material design because the aromatic ring provides etch resistance, the dissolution rate of the polymer is adjustable, and crosslinking efficiency is controllable by a proper choice of substituent group $R^5$.

Other main constituent units which can be incorporated in the polymer PB include units of the general formula (4) and/or (5).

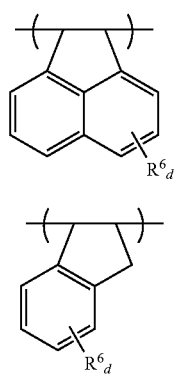

Herein d is an integer of 0 to 4, and $R^6$ is each independently a hydroxyl group, halogen atom, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group.

Examples of the group $R^6$ in formulae (4) and (5) except for hydroxyl are the same as listed in conjunction with formula (3).

When units of formulae (4) and/or (5) are used as constituent units in polymer PB, there are obtained the advantages that the aromatic ring provides etch resistance and the addition of cyclic structure to the main chain enhances resistance to EB irradiation during etching or pattern inspection.

The basic polymer PB may be designed as comprising the foregoing recurring units in a compositional ratio to be described below. The recurring units (1) contained in polymer PB for endowing it with etch resistance, polarity and solubility in alkaline developer are preferably incorporated in a content of at least 30 mol %, more preferably at least 40 mol %, so as to provide an alkaline solubility to such an extent as to leave no residues after development, although the content varies depending on the strength of polarity, the fat solubility of aromatic ring, and the presence or absence of alkyl substituent group. The recurring units (1) may be of one type or a mixture of two or more types. With respect to the upper limit of the content of recurring units (1) in polymer PB, recurring units (1) may be all constituent units of polymer PB excluding recurring units (2) when a blend of polymer PB with another polymer is used as component (A).

With respect to the content of basic recurring units (2), the polymer design must be made between a proportion of these units in overall polymers in the resist composition (of which a resist film is made) and a proportion of these units in a single polymer PB. To attain the benefits of the invention, design is made such that the content of recurring units (2) is preferably 0.005 to 10 mol %, more preferably 0.01 to 3 mol %, and even more preferably 0.1 to 1.5 mol % based on the total recurring units in overall polymers in the resist composition. In an embodiment wherein all polymer as component (A) is polymer PB and the polymer PB is a single one, the content of basic recurring units (2) is preferably 0.005 to 10 mol %, more preferably 0.01 to 3 mol %, and even more preferably 0.1 to 1.5 mol % of the polymer PB.

When polymer PB is blended with another polymer or a polymer different from polymer PB, i.e., a basic side chain-free polymer is used as the polymer of component (A), a polymer having a compositional ratio deviating from the above range may be compounded. To maximize the content of recurring units (2), all recurring units excluding the necessary content of recurring units (1) may be recurring units (2). In this case, a polymer PB having a content of recurring units (2) which is preferably up to 70 mol %, more preferably up to 60 mol %, and even more preferably up to 50 mol % may be compounded, thereby achieving a satisfactory quench effect on resist pattern formation. The recurring units (2) may be of one type or a mixture of two or more types. The lower limit of the content of recurring units (2) is preferably at least 1 mol %, more preferably at least 5 mol % because of ease of formulation of a corresponding monomer during polymerization.

The recurring units (3) serve to control the reactivity of the polymer with the crosslinker and to control the solubility of the polymer in alkaline developer. The recurring units (3) are not essential for polymer PB when another polymer different from polymer PB is used as a part of component (A) for controlling the concentration of recurring units (3) in the resist film and the solubility of the resist film in developer. However, the inclusion of recurring units (3) is preferred to ensure a degree of freedom in designing a blend of polymers. When included, the recurring units (3) are preferably incorporated in a content of 5 to 40 mol %, more preferably 5 to 30 mol % based on the overall recurring units of polymer PB. The recurring units (3) may be of one type or a mixture of two or more types.

The recurring units (4) and (5) serve to improve etch resistance by imparting a cyclic structure to the main chain. The recurring units (4) and (5) each may be of one type or a mixture of two or more types. For the purpose of improving etch resistance, recurring units (4) and (5) are preferably incorporated in a content of at least 5 mol % based on the overall recurring units of polymer PB. Where the functional group in recurring units (4) and (5) is hydroxyl, the content of recurring units (4) and (5) incorporated is added to the content of recurring units (1) so that the sum may fall in the above-defined range of recurring units (1). Where recurring units (4) and (5) have no functional group or the functional group is other than hydroxyl, the content of recurring units (4) and (5) incorporated is preferably up to 30 mol %. Where recurring units (4) and (5) have no functional group or the functional group is other than hydroxyl, a content of recurring units (4) and (5) in excess of 30 mol % may cause development defects.

While the polymer PB comprises the foregoing recurring units as the main constituent units desirably in the above-defined contents, it may further comprise any commonly used, well-known recurring units as additional recurring units, typically in a content of up to 30 mol %. Suitable additional recurring units include (meth)acrylate units having an oxirane ring, commonly used as crosslinking units, and (meth)acrylate units having an adhesive group such as lactone structure. The properties of the resist film may be finely adjusted by controlling the content of the additional recurring units although the additional recurring units may be omitted.

The polymer PB comprising the foregoing recurring units may be prepared by effecting copolymerization of monomers by any well-known techniques with an optional combination of protection and deprotection reactions. The copolymerization reaction is preferably radical, anionic or coordination polymerization, but not limited thereto. With respect to the polymerization reaction, reference should be made to Patent Documents 2 to 5.

The polymer PB generally has a weight average molecular weight (Mw) of 1,000 to 50,000, and preferably 1,000 to 20,000, as measured by gel permeation chromatography (GPC) using polystyrene standards. A polymer with a Mw of less than 1,000 may lead to a pattern having a rounded top, reduced resolution, and degraded LER as is well known in the art. If Mw is higher than the necessity, the pattern tends to have increased LER, depending on the pattern size to be resolved. The Mw is preferably controlled to 20,000 or less particularly when a pattern having a line width of up to 100 nm is formed.

The polymer PB preferably has a narrow dispersity as demonstrated by a molecular weight distribution Mw/Mn in the range of 1.0 to 3.0, more preferably 1.0 to 2.5. A broader dispersity may cause drawbacks to the pattern such as foreign matter after development and degraded profile.

The polymer belonging to component (A) in the resist composition may all be polymer PB which also serves as component (C) or include, in part, a polymer not belonging to component (C). With respect to the polymer other than polymer PB, that is, a polymer belonging to component (A), but not falling in the concept of component (C), use may be made of any polymers, as used in well-known chemically amplified negative resist compositions, which polymers are normally alkali soluble and turn alkali insoluble upon exposure to high-energy radiation in the presence of an acid generator and a crosslinker. Since the other polymer should not undergo phase separation when mixed with the polymer falling in the concept of component (C), a polymer comprising recurring units of analogous fundamental structure, but free of amino-containing recurring units is preferably selected. Namely, when the other polymer is combined with a polymer comprising recurring units (1) and falling in the concept of component (C), it should preferably comprise recurring units having an aromatic ring, for example, styrene derivative units or (meth)acrylic acid aromatic ester units.

For example, when a polymer comprising recurring units selected from formulae (1) to (3) is used for the EB or EUV lithography, a polymer comprising recurring units (1) and (3) is preferably selected as the other polymer belonging to component (A), but not falling in the concept of component (C). Since recurring units (4) and (5) may be handled as mutually analogous recurring units (though their analogy needs not be strict), a heterogeneous combination like a combination of a polymer comprising recurring units mostly derived from a (meth)acrylic acid monomer with a polymer comprising recurring units mostly derived from a styrene monomer is undesirable.

Whether the polymer used as component (A) is a blend of polymers PB, or a blend of polymer PB with another polymer belonging to component (A), or polymer PB alone, the polymer is designed as a whole to comprise respective recurring units in a proper compositional ratio so as to provide a solubility in alkaline developer and a crosslinking reactivity as required for the polymer to be formulated in chemically amplified negative resist compositions. While the preferred compositional ratio of recurring units (2) is as defined above, the whole polymer used as component (A) which is composed mainly of recurring units (1) to (5) is designed such that the content of recurring units (1) is preferably 50 to 90 mol %, more preferably 60 to 85 mol % based on the total recurring units of the polymer(s) belonging to component (A). Where the functional group represented by $R^6$ in recurring units (4) and (5) is not hydroxyl, the total content of recurring units (3) and recurring units (4) and (5) is preferably 5 to 40 mol %, more preferably 5 to 30 mol %, and the total content of recurring units (4) and (5) is preferably up to 30 mol %. Where the functional group represented by $R^6$ is hydroxyl, the content of recurring units (4) and (5) is added to the content of recurring units (1) so that the sum may fall in the preferred range of recurring units (1) defined above.

Shown below are exemplary combinations of recurring units that constitute a polymer not falling in the concept of component (C) which is preferred for blending with polymer PB comprising recurring units (1) to (3) and optionally recurring units (4) and (5) as constituent units, that is, the polymer falling in the concept of component (C).

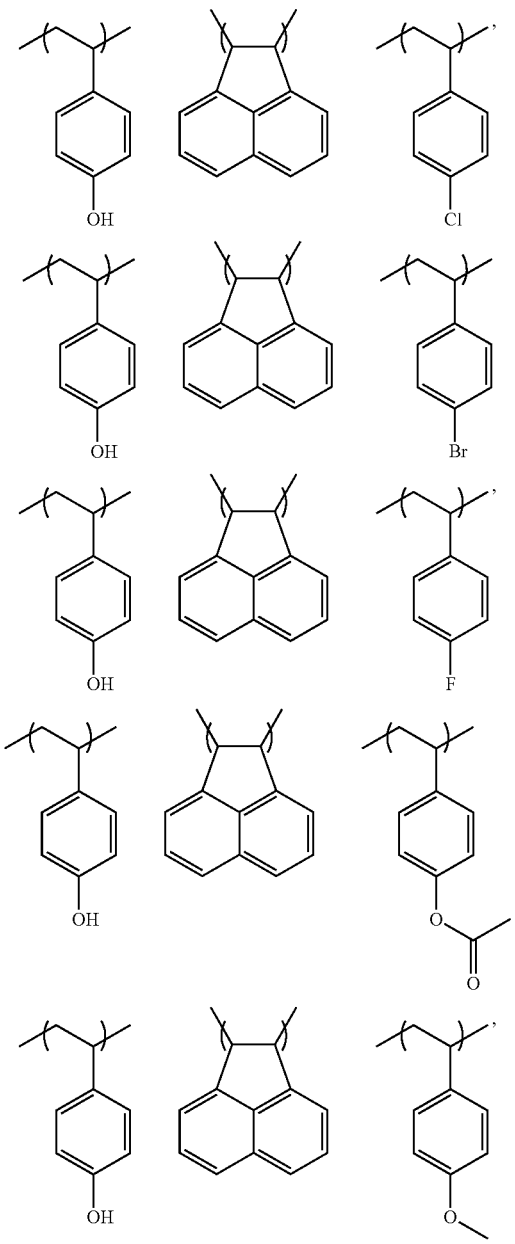

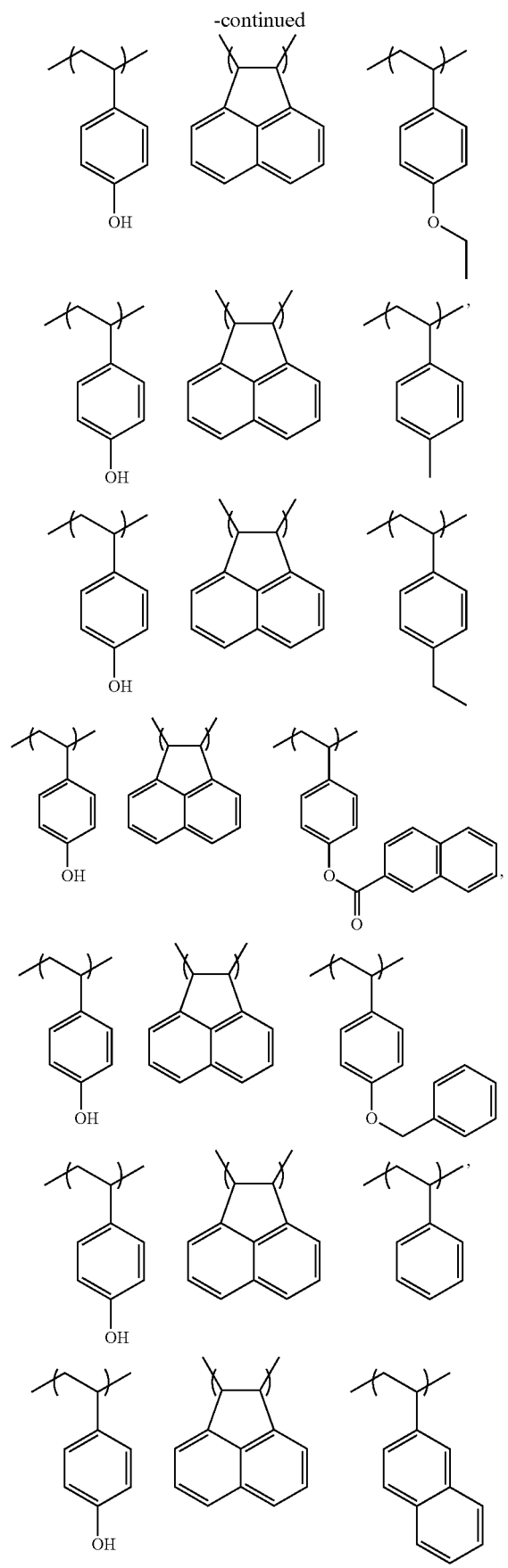
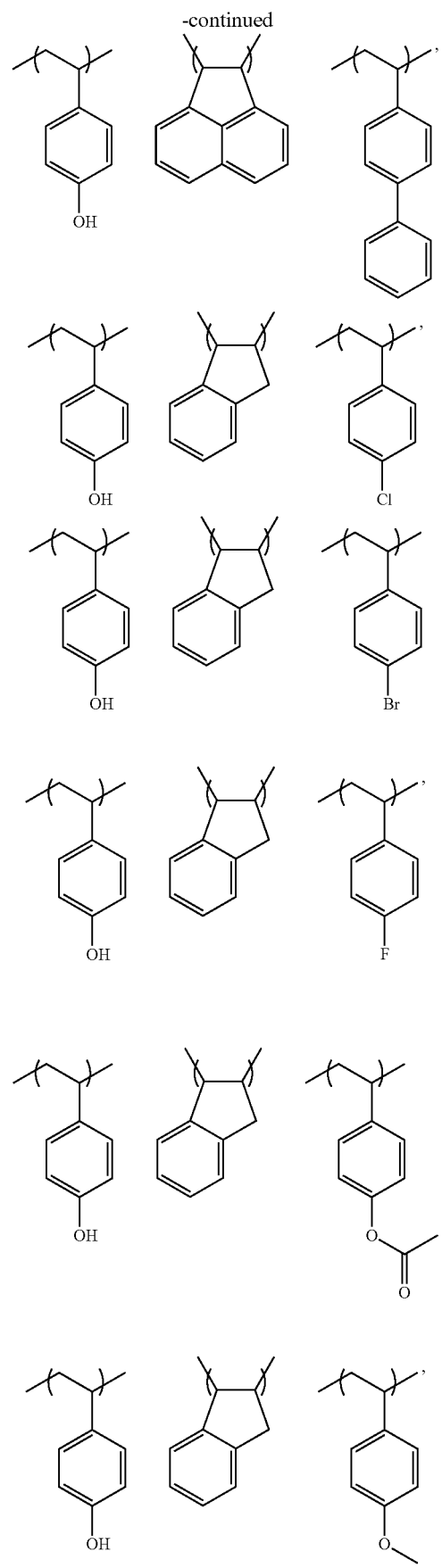

-continued

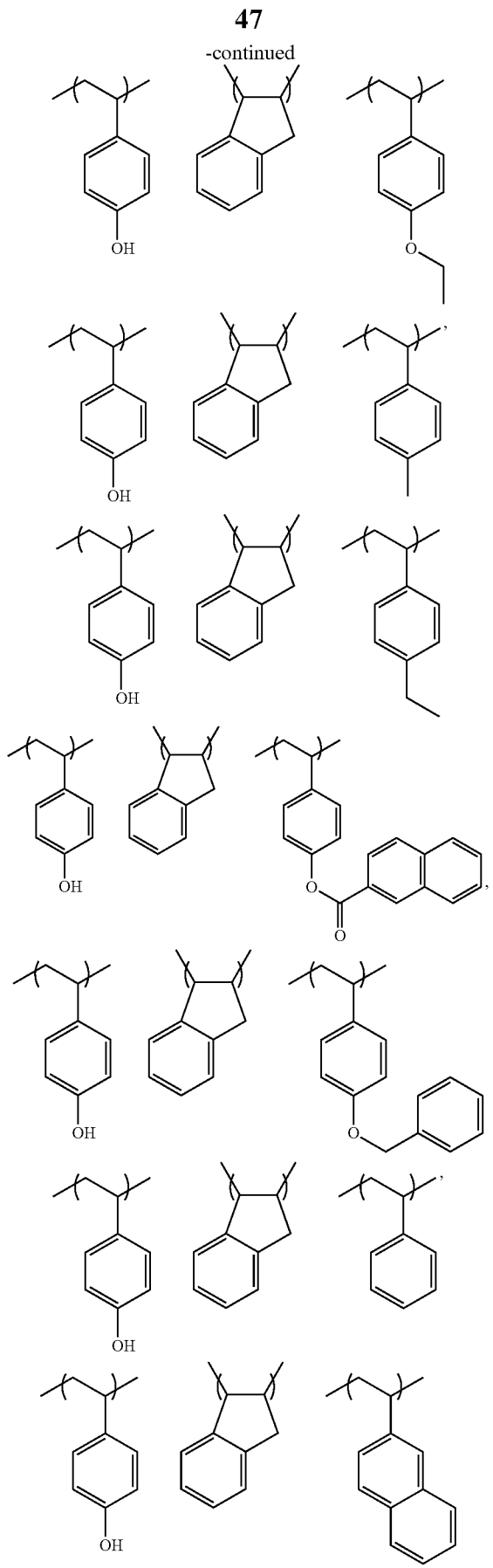

-continued

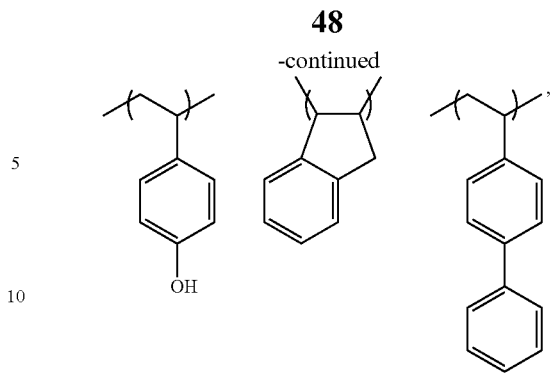

Blending a large amount of a polymer different from polymer PB, that is, not falling in the concept of component (C) may cause to increase roughness because of a microscopic localization of units having a basic function. To exert the maximum effect in theory, it is desirable that all the polymer used as component (A) be polymer PB. However, it is believed that the undesired diffusion phenomenon of a basic substance which occurs due to solvent evaporation upon resist film formation and the surface energy of substrate and resist film when a basic substance having a low molecular weight of up to 1,000 is used is prevented by converting the basic substance to a high molecular weight form. In fact, even when a certain amount of a polymer not falling in the concept of component (C) is added to a resist composition, a resist pattern resulting from a resist film of the resist composition is observed to exert the roughness reducing effect.

Then, when another polymer used as component (A), but not falling in the concept of component (C) is blended with polymer PB falling in the concept of component (C), the content of the other polymer used as component (A), but not falling in the concept of component (C) is preferably up to 99.5 parts, more preferably up to 99 parts by weight per 100 parts by weight of the overall polymers in the resist composition. If the content of the other polymer used as component (A), but not falling in the concept of component (C) is above the range (leading to excessive localization of the basic polymer), the resist may suffer a loss of resolution and an increase of roughness.

Like well-known chemically amplified negative resist compositions, the negative resist composition of the invention may further comprise a crosslinker. The crosslinker may be omitted when the polymer as component (A) comprises recurring units having a function of forming crosslinks in the presence of the acid catalyst so that the polymer may turn alkali insoluble in the presence of the acid catalyst.

The recurring units having a function of forming crosslinks in the presence of the acid catalyst take a reaction mechanism that they form crosslinks within the polymer and/or between polymer molecules through electrophilic reaction with formula (1). In this case, the recurring units having a function of forming crosslinks in the presence of the acid catalyst are preferably recurring units containing a functional group such as an oxirane ring or acetal structure. Preferred examples of the recurring units having such a function include the following units M-1 and M-2.

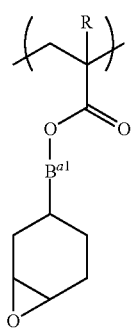

M-1

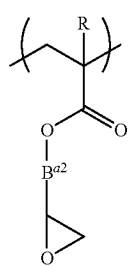

M-2

Herein R is hydrogen or methyl, $B^{a1}$ is a single bond or a $C_1$-$C_{10}$ alkylene group which may be separated by an ether bond, $B^{a2}$ is a $C_2$-$C_{10}$ alkylene group which may be separated by an ether bond, with the proviso that when $B^{a1}$ and $B^{a2}$ contain an ether bond, the ether bond is introduced at a remoter position than β-position relative to the ester oxygen.

Of the above recurring units, preference is given to units M-1. In particular, units M-1 wherein $B^{a1}$ is a single bond, methylene or ethylene are more preferred because they do not detract from the robustness and etch resistance of the polymer.

When the crosslinkable recurring units are incorporated in the polymer as component (A), their content is typically at least 5 mol % based on the overall polymer to maintain a dissolution change ability and the upper limit is about 50 mol %. Then the above-described polymer design is applicable without modification.

Addition of a crosslinker is a common practice. While an acid which is generated by a PAG acts as a catalyst, the crosslinker reacts with the polymer to form crosslinks within the polymer and between polymer molecules for thereby rendering the polymer alkali insoluble. It is typically a compound having a plurality of functional groups capable of electrophilic reaction with aromatic rings or hydroxyl groups in constituent units of the polymer to form bonds therewith. A number of compounds are well known as the crosslinker.

As the crosslinker used herein, any well-known crosslinkers may be applicable. Suitable crosslinkers include alkoxymethylglycolurils and alkoxymethylmelamines. Exemplary of the alkoxymethylglycolurils are tetramethoxymethylglycoluril, 1,3-bismethoxymethyl-4,5-bismethoxyethyleneurea, and bismethoxymethylurea. Exemplary of the alkoxymethylmelamines are hexamethoxymethylmelamine and hexaethoxymethylmelamine.

In the negative resist composition, the crosslinker is preferably added in an amount of 2 to 40 parts, more preferably 5 to 20 parts by weight per 100 parts by weight of the base polymer. The crosslinker may be used alone or in admixture of two or more.

Component (B) is an acid generator. It is a compound which is decomposed to generate an acid upon exposure to high-energy radiation. A number of acid generators are known for use in chemically amplified resist compositions, as described in Patent Documents 1, 2 and 3, for example. Generally any of these acid generators may be used. For use in the EB and EUV lithography, sulfonium base acid generators are useful, and a number of suitable compounds are also known. Further, the sulfonium base acid generator may take the form of a polymer having the acid generator incorporated in a side chain from its recurring unit as described in Patent Document 6.

Preferred examples of the acid generator are illustrated below, but not limited thereto.

Shown below are examples of the acid generator as component (B) which is not incorporated in a polymer.

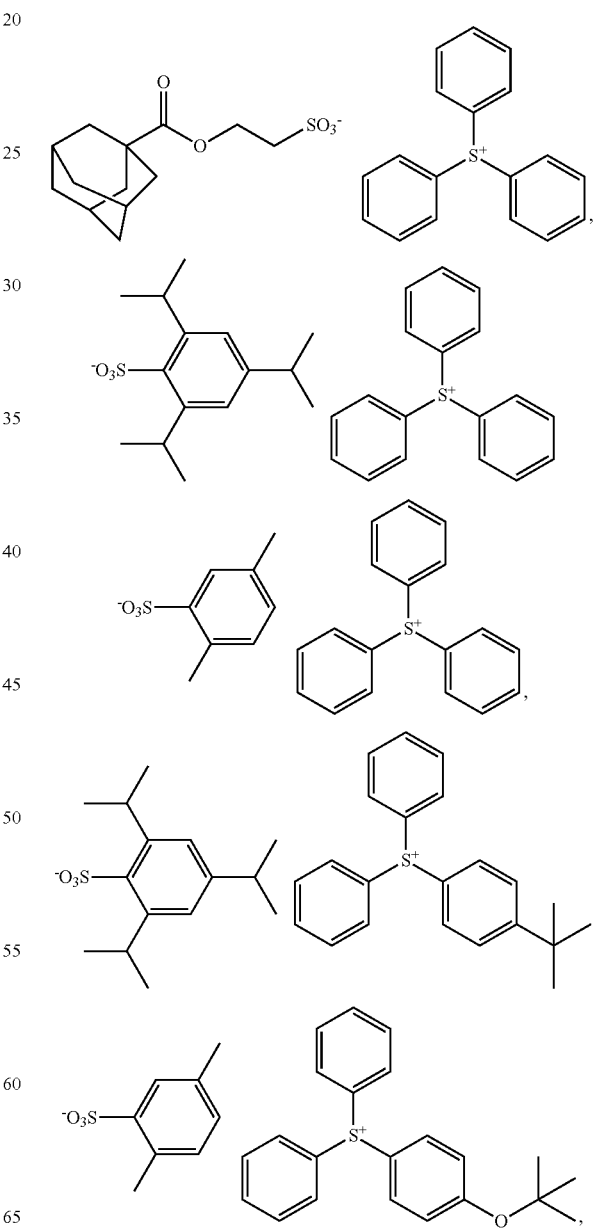

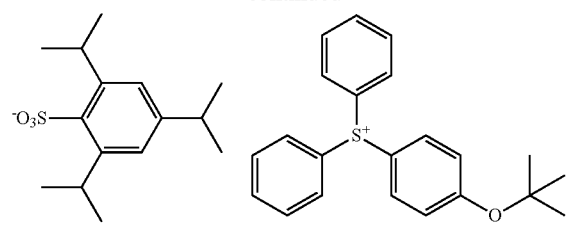
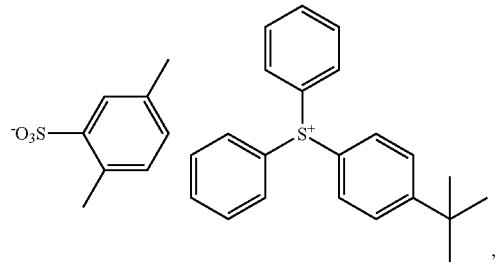
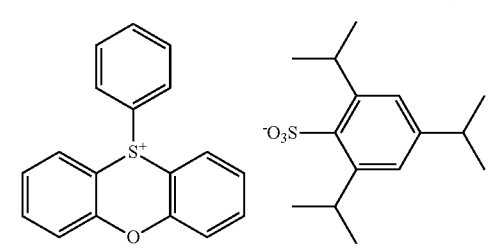
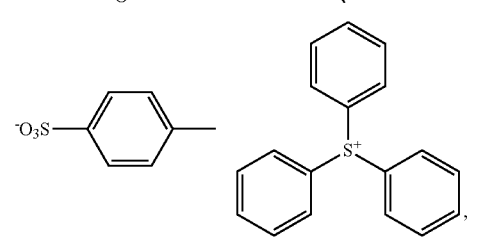
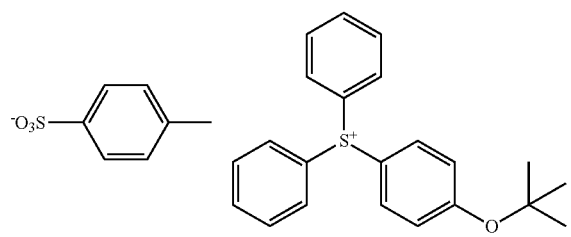
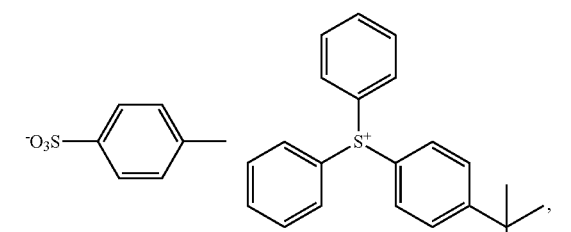
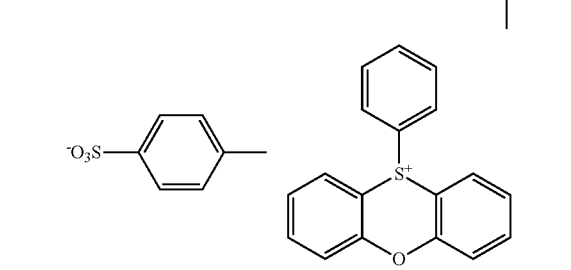
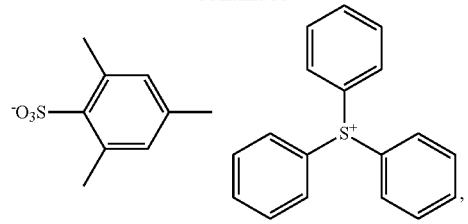
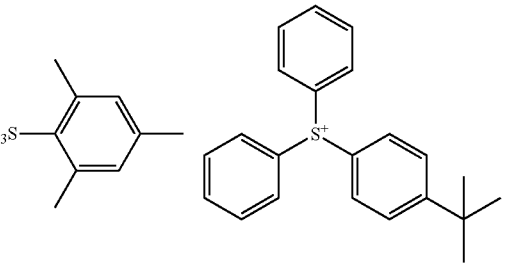
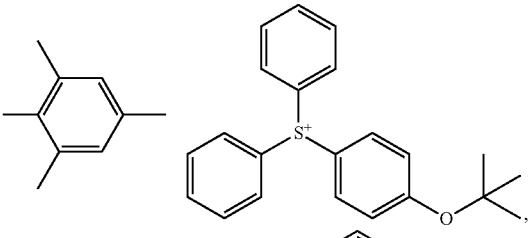
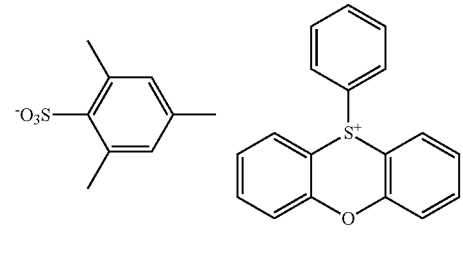
Shown below are examples of the polymer having the acid generator as component (B) incorporated therein.
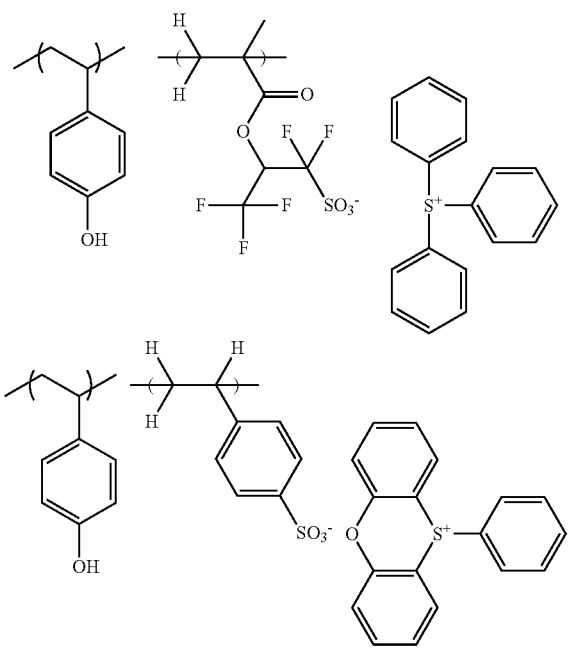

53
-continued
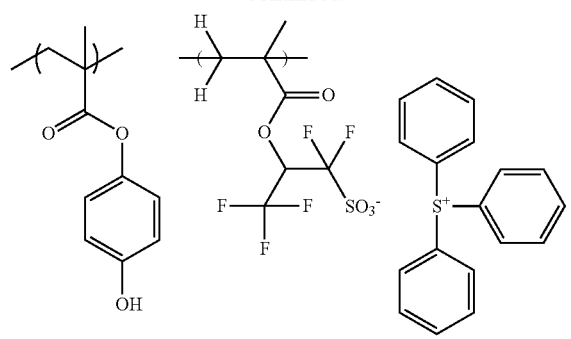
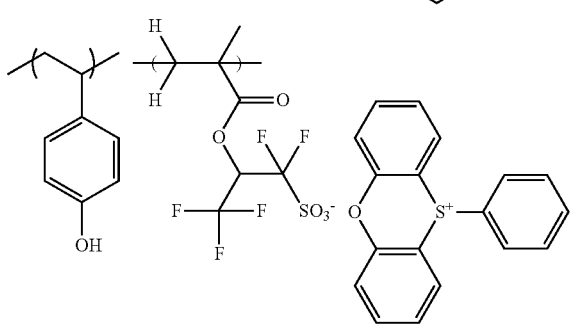
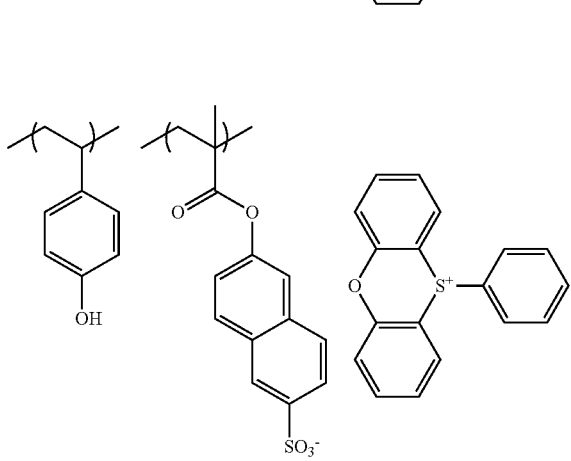
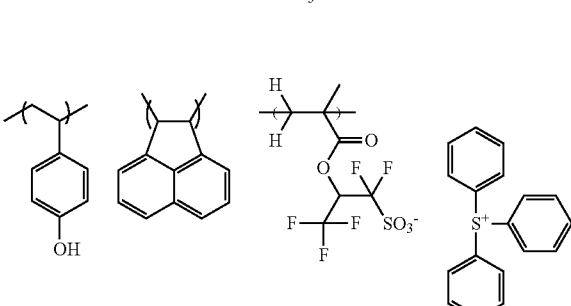
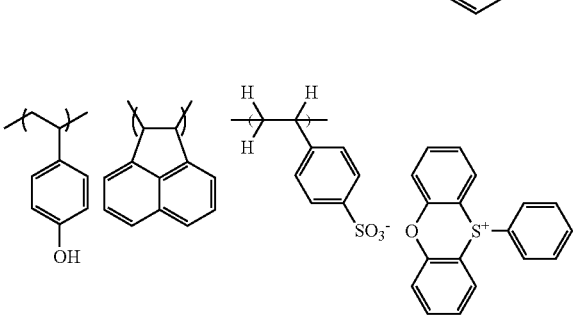
54
-continued
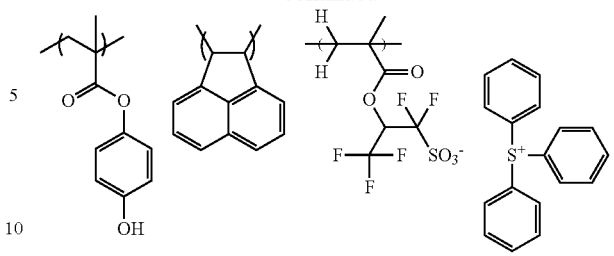
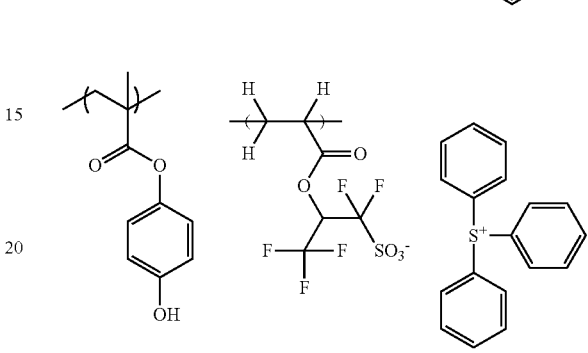
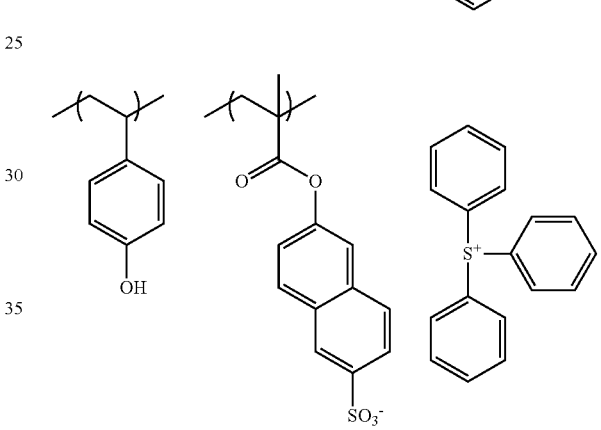
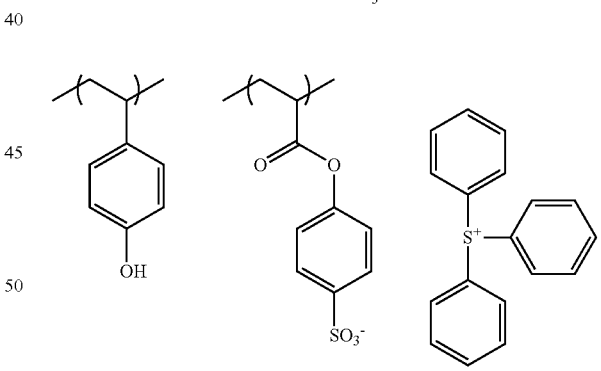
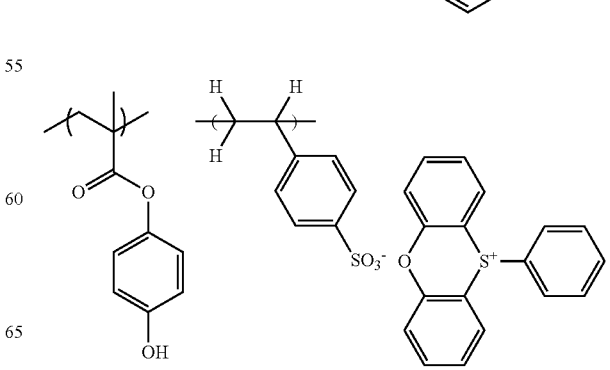

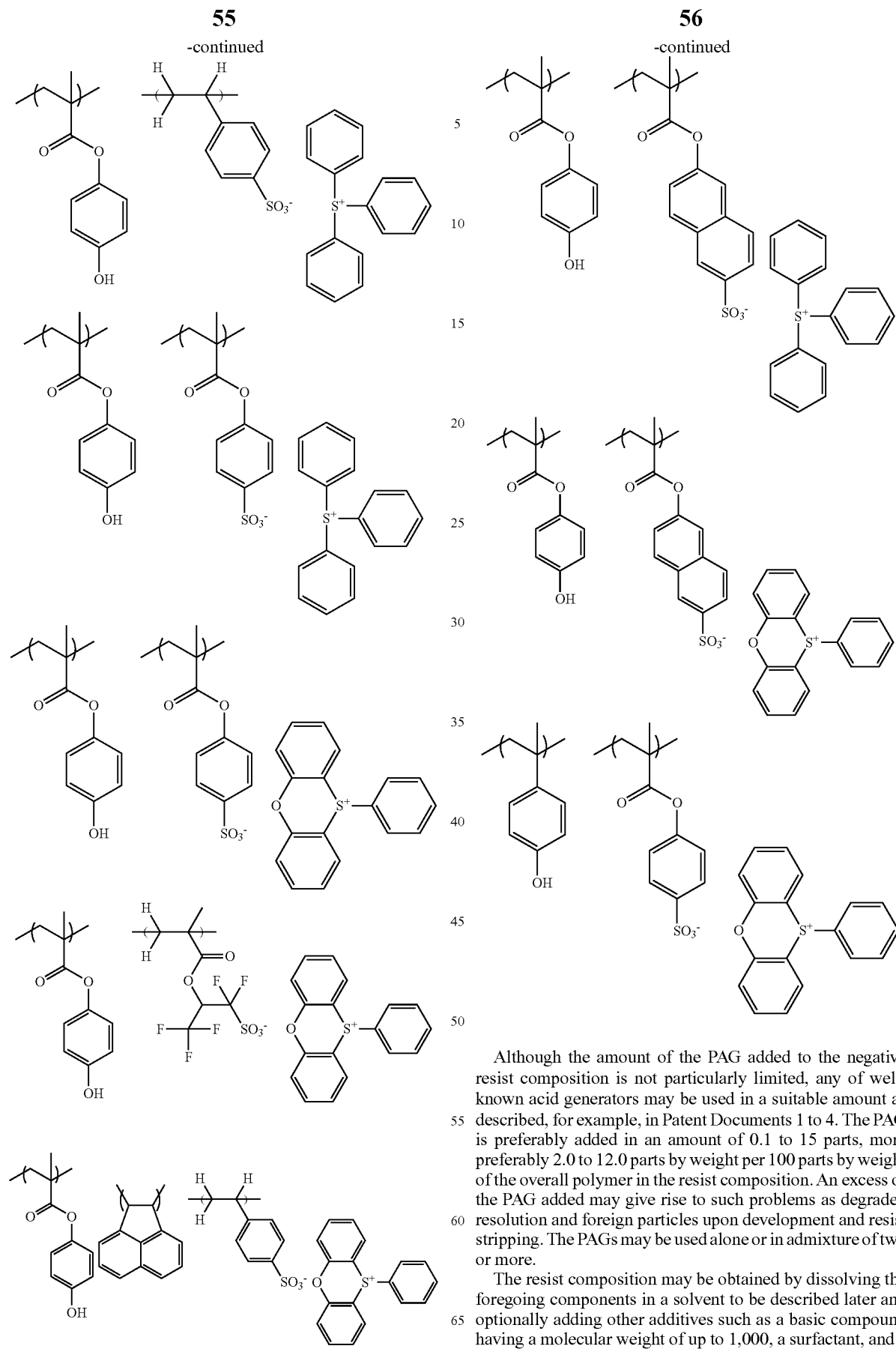

Although the amount of the PAG added to the negative resist composition is not particularly limited, any of well-known acid generators may be used in a suitable amount as described, for example, in Patent Documents 1 to 4. The PAG is preferably added in an amount of 0.1 to 15 parts, more preferably 2.0 to 12.0 parts by weight per 100 parts by weight of the overall polymer in the resist composition. An excess of the PAG added may give rise to such problems as degraded resolution and foreign particles upon development and resist stripping. The PAGs may be used alone or in admixture of two or more.

The resist composition may be obtained by dissolving the foregoing components in a solvent to be described later and optionally adding other additives such as a basic compound having a molecular weight of up to 1,000, a surfactant, and a dissolution inhibitor.

In the resist composition of the invention, a basic compound need not be positively added because a basic component is contained in the polymer. Nevertheless, it is acceptable to add a basic compound having a molecular weight of up to 1,000 for fine adjustment of a pattern profile such as overhanging at the top or footing near the substrate and fine adjustment of sensitivity. When used, the basic compound is preferably added in an amount of 0.01 to 2 parts, more preferably 0.01 to 0.5 parts by weight per 100 parts by weight of the overall polymer.

With respect to the basic compound which is added separately from polymer PB, a number of suitable compounds are known, for example, from Patent Documents 1 to 4. Examples include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, carbamate derivatives, and ammonium salts. Numerous examples of these basic compounds are described in Patent Document 2. Generally any of these basic compounds may be used. Two or more may be selected from these basic compounds and used in admixture.

Examples of the basic compound which is preferably compounded herein include tris(2-(methoxymethoxy)ethyl)amine, tris(2-(methoxymethoxy)ethyl)amine N-oxide, morpholine derivatives, and imidazole derivatives.

An amine is effective when a resist pattern is formed on a substrate, typically a substrate having a surface layer of chromium compound, which is susceptible to a phenomenon that the resist film becomes substantially insoluble at the substrate interface during pattern formation, known as a footing phenomenon. Specifically, an amine compound or amine oxide compound having a carboxyl group, but free of hydrogen in covalent bond with nitrogen serving as basic center (exclusive of those amine and amine oxide compounds whose nitrogen atom is contained in the cyclic structure of aromatic ring) is effectively used for improving the pattern profile.

Preferred examples of the amine or amine oxide compound having a carboxyl group, but free of hydrogen in covalent bond with nitrogen serving as basic center include compounds of the general formulae (10) to (12), but are not limited thereto.

(10)

(11)

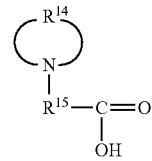

(12)

Herein $R^{10}$ and $R^{11}$ are each independently a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, or $C_2$-$C_{10}$ alkylthioalkyl group. $R^{10}$ and $R^{11}$ may bond together to form a ring with the nitrogen atom to which they are attached. $R^{12}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl group, $C_2$-$C_{10}$ alkylthioalkyl group, or halogen. $R^{13}$ is a single bond, a straight, branched or cyclic $C_1$-$C_{20}$ alkylene group, or $C_6$-$C_{20}$ arylene group. $R^{14}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group. $R^{15}$ is a straight, branched or cyclic $C_1$-$C_{20}$ alkylene group or $C_6$-$C_{20}$ arylene group.

Exemplary groups in these structural formulae are given below, but not limited thereto. Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_2$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and isomers of their alkyl moiety. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_2$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl.

Preferred examples of the amine compound of formula (10) include, but are not limited thereto, o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalenic acid, 3-diethylamino-2-naphthalenic acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl)benzoic acid, and 2-(4-(dibutylamino)-2-hydroxybenzoyl)benzoic acid.

Preferred examples of the amine oxide compound of formula (11) include oxidized forms of exemplary amine compounds of formula (10), but are not limited thereto.

Preferred examples of the amine compound of formula (12) include, but are not limited thereto, 1-piperidinepropionic acid, 1-piperidinebutyric acid, 1-piperidinemalic acid, 1-piperidinepyruvic acid, and 1-piperidinelactic acid.

Some of the compounds having an amine oxide structure represented by formula (11) are existing and some are novel compounds. They may be prepared by selecting an optimum method in accordance with a particular structure. Exemplary non-limiting methods include oxidizing reaction of a nitrogen-containing compound using an oxidizing agent and oxidizing reaction of a nitrogen-containing compound in a hydrogen peroxide water diluted solution. These methods are described below in detail.

One exemplary method for preparing a nitrogen-containing alcohol compound through esterifying reaction is shown below. This method is applicable to the synthesis of a compound of formula (11).

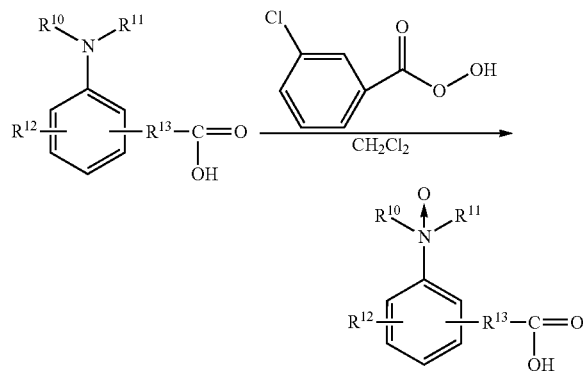

Herein $R^{10}$ to $R^{13}$ are as defined above.

This reaction is an oxidizing reaction of an amine using an oxidizing agent, m-chloroperbenzoic acid. The reaction may be performed using other oxidizing agents commonly employed in standard oxidizing reaction. Following the reaction, the reaction mixture may be purified by standard techniques such as distillation, chromatography and recrystallization. Reference is made to Patent Document 7.

To the resist composition, any of surfactants commonly used for improving coating characteristics may be added. A number of surfactants are well known and described in Patent Documents 1 to 5 and any suitable one may be selected therefrom.

In the resist composition, the surfactant is preferably formulated in an amount of up to 2 parts, and more preferably up to 1 part by weight, per 100 parts by weight of the overall polymer. When used, the surfactant is preferably added in an amount of at least 0.01 part by weight.

An organic solvent may be used in the preparation of the resist composition. It may be any of organic solvents in which the polymer(s), acid generator and other additives are dissolvable. Suitable organic solvents include, but are not limited to, ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in admixture. Of these solvents, ethyl lactate, propylene glycol monomethyl ether, PGMEA, and mixtures thereof are preferred because the acid generator is most soluble therein.

In the negative resist composition, the organic solvent is preferably used in an amount of 1,000 to 10,000 parts by weight, more preferably 2,000 to 9,700 parts by weight per 100 parts by weight of the overall polymer. When adjusted to such a concentration, the resist composition is applicable by a spin coating technique to form a resist film having a thickness of 10 to 200 nm and an improved flatness in a consistent manner.

Process

Pattern formation using the resist composition of the invention may be performed by well-known lithography processes. The process generally involves coating, prebaking, exposure to EB or EUV, PEB, and development with alkaline developer. The resist composition is first applied onto a substrate for IC fabrication (silicon wafer having a surface layer of Si, $SiO_2$, SiN, SiON, TiN, WSi, BPSG, SOG, organic antireflective coating or the like) or a substrate for mask circuit fabrication (quartz substrate having a surface layer of Cr, CrO, CrON, MoSi or the like) by a suitable coating technique such as spin coating. The coating is prebaked on a hot plate at a temperature of 60 to 150° C. for 1 to 10 minutes, preferably 80 to 140° C. for 1 to 5 minutes to form a resist film of 0.05 to 2.0 µm thick.

Then the resist film is exposed to high-energy radiation, typically EUV through a mask having a desired pattern. Alternatively, a pattern is written on the resist film directly with EB. The exposure dose is preferably 1 to 200 mJ/cm², more preferably 10 to 100 mJ/cm². The exposure may be performed by conventional lithography whereas the immersion lithography of holding a liquid between the mask and the resist film may be employed if desired. In this case, a protective film which is insoluble in water may be applied on the resist film. The resist film is then baked (PEB) on a hot plate at 60 to 150° C. for 1 to 5 minutes, preferably 80 to 140° C. for 1 to 3 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

One advantage is that the resist film has high etch resistance. Also the resist composition is effective when it is required that the pattern experience a minimal change of line width even when the duration between exposure and PEB is prolonged. Because of these advantages, the resist composition is effective in processing a photomask blank by EB lithography. The resist composition is effectively applicable to a processable substrate, specifically a substrate having a surface layer of material to which a resist film is less adherent and which is likely to invite pattern stripping or pattern collapse, and particularly a substrate having sputter deposited thereon a surface layer material susceptible to pattern collapse, typically metallic chromium or a chromium compound containing at least one light element selected from oxygen, nitrogen and carbon. Substrates of this nature are often used in photomask blanks, and the invention is effective for pattern formation on these substrates.

EXAMPLE

Synthesis Examples, Examples, and Comparative Examples are given below by way of illustration and not by way of limitation. The average molecular weights including weight average molecular weight (Mw) and number average molecular weight (Mn) are determined by gel permeation chromatography (GPC) versus polystyrene standards, from which a dispersity (Mw/Mn) is computed. Me stands for methyl. The compositional ratio of a copolymer is on a molar basis.

Polymer Synthesis Example 1

In a 200-mL dropping funnel under nitrogen blanket, a solution was prepared by dissolving 35.5 g of 4-hydroquinone monomethacrylate, 4.7 g of acenaphthylene, 9.2 g of 4-methylstyrene, 0.62 g of a monomer Z-1 of the structure shown below, and 6.8 g of dimethyl 2,2'-azobis(2-methyl-propionate) (V601, Wako Pure Chemical Industries, Ltd.) in 64 g of methyl ethyl ketone (MEK) as a solvent. A 300-mL polymerization flask was purged with nitrogen, charged with 53 g of MEK, and heated at 80° C., after which the solution was added dropwise to the flask over 4 hours. After the completion of dropwise addition, stirring was continued for 16 hours while maintaining the polymerization temperature of 80° C. The polymerization solution was then cooled down to room temperature and added dropwise to 1,000 g of hexane whereupon a copolymer precipitated. The copolymer precipitate was collected by filtration and washed twice with 200 g of hexane. The mass collected by filtration was dissolved in 120 g of MEK. The MEK solution was passed through a nylon filter with a pore size of 0.02 μm and added dropwise to 1,000 g of hexane whereupon the copolymer precipitated. The copolymer precipitate was collected by filtration, washed twice with 200 g of hexane, and dried, yielding 40 g of a white copolymer, designated Polymer 1, having Mw=3,800 and Mw/Mn=1.65.

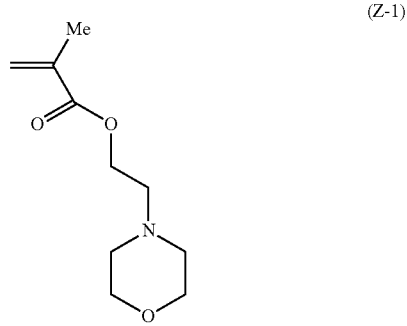

(Z-1)

Polymer Synthesis Example 2

In a 200-mL dropping funnel under nitrogen blanket, a solution was prepared by dissolving 36.2 g of 4-(1-ethoxy-ethoxy)styrene, 4.5 g of acenaphthylene, 8.7 g of 4-methylstyrene, 0.59 g of monomer Z-1 of the above structure, and 5.4 g of dimethyl 2,2'-azobis(2-methyl-propionate) (V601, Wako Pure Chemical Industries, Ltd.) in 64 g of propylene glycol monomethyl ether (PGME) as a solvent. A 300-mL polymerization flask was purged with nitrogen, charged with 53 g of PGME, and heated at 80° C., after which the solution was added dropwise to the flask over 4 hours. After the completion of dropwise addition, stirring was continued for 20 hours while maintaining the polymerization temperature of 80° C. Thereafter, the polymerization solution was cooled down to room temperature, combined with 18 g of methanol and 0.85 g of oxalic acid dihydrate, and stirred at 50° C. for 3 hours. The reaction solution was added dropwise to a mixture of 1,620 g of water and 30 g of methanol whereupon a copolymer precipitated. The copolymer precipitate was collected by filtration, washed twice with a mixture of 490 g of water and 10 g of methanol, and dried, yielding 35.0 g of a white hydroxystyrene copolymer, designated Polymer 2, having Mw=4,860 and Mw/Mn=1.63.

Polymer Synthesis Examples 3 to 23

Resins (Polymers 3 to 23) shown in Table 1 were synthesized by the same procedure as Polymer Synthesis Example 1 or 2 except that the type and amount of monomers were changed. The units 1 to 4 in Table 1 have the structure shown in Table 2. In Table 1, a ratio of each unit incorporated is on a molar basis.

TABLE 1

| Resin | Unit 1 (ratio) | Unit 2 (ratio) | Unit 3 (ratio) | Unit 4 (ratio) |
| --- | --- | --- | --- | --- |
| Polymer 1 | A-1 (0.69) | B-1 (0.20) | C-2 (0.10) | Z-1 (0.01) |
| Polymer 2 | A-2 (0.74) | B-1 (0.15) | C-2 (0.10) | Z-1 (0.01) |
| Polymer 3 | A-1 (0.69) | B-1 (0.20) | C-1 (0.10) | Z-1 (0.01) |
| Polymer 4 | A-1 (0.64) | B-2 (0.25) | C-2 (0.10) | Z-1 (0.01) |
| Polymer 5 | A-1 (0.67) | B-3 (0.22) | C-2 (0.10) | Z-1 (0.01) |
| Polymer 6 | A-1 (0.68) | B-4 (0.21) | C-2 (0.10) | Z-1 (0.01) |
| Polymer 7 | A-2 (0.67) | B-2 (0.22) | C-2 (0.10) | Z-1 (0.01) |
| Polymer 8 | A-2 (0.72) | B-3 (0.17) | C-2 (0.10) | Z-1 (0.01) |
| Polymer 9 | A-2 (0.73) | B-4 (0.16) | C-2 (0.10) | Z-1 (0.01) |
| Polymer 10 | A-3 (0.79) | B-3 (0.10) | C-2 (0.10) | Z-1 (0.01) |
| Polymer 11 | A-1 (0.70) | B-3 (0.15) | C-2 (0.10) | Z-1 (0.05) |
| Polymer 12 | A-2 (0.74) | B-3 (0.11) | C-2 (0.10) | Z-1 (0.05) |
| Polymer 13 | A-1 (0.70) | B-1 (0.10) | C-2 (0.10) | Z-1 (0.10) |
| Polymer 14 | A-2 (0.74) | B-1 (0.06) | C-2 (0.10) | Z-1 (0.10) |
| Polymer 15 | A-1 (0.64) | B-2 (0.16) | C-2 (0.10) | Z-1 (0.10) |
| Polymer 16 | A-1 (0.67) | B-3 (0.13) | C-2 (0.10) | Z-1 (0.10) |
| Polymer 17 | A-1 (0.68) | B-4 (0.12) | C-2 (0.10) | Z-1 (0.10) |
| Polymer 18 | A-2 (0.67) | B-2 (0.13) | C-2 (0.10) | Z-1 (0.10) |
| Polymer 19 | A-2 (0.72) | B-3 (0.08) | C-2 (0.10) | Z-1 (0.10) |
| Polymer 20 | A-2 (0.73) | B-4 (0.07) | C-2 (0.10) | Z-1 (0.10) |
| Polymer 21 | A-3 (0.80) | B-3 (0.05) | C-2 (0.05) | Z-1 (0.10) |
| Polymer 22 | A-1 (0.80) | Z-1 (0.20) | — | — |
| Polymer 23 | A-2 (0.80) | Z-1 (0.20) | — | — |

TABLE 2

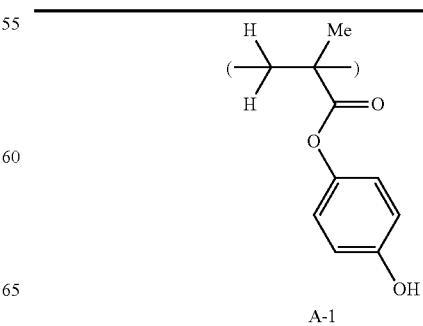

A-1

TABLE 2-continued

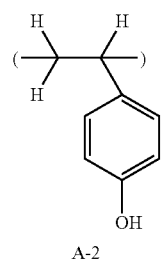
A-2

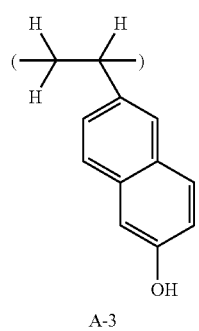
A-3

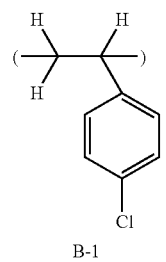
B-1

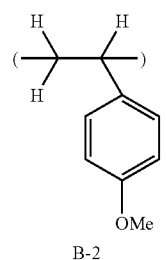
B-2

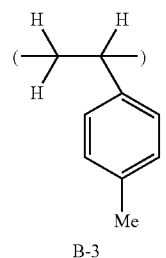
B-3

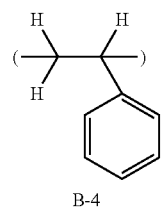
B-4

TABLE 2-continued

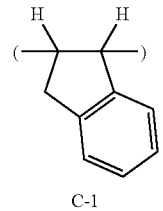
C-1

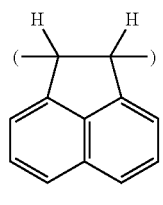
C-2

Examples and Comparative Examples

Preparation of Negative Resist Compositions

Resist compositions were prepared by using inventive resins (Polymer 1 to 23) or other resins (Polymers K and M), and dissolving the polymer, an acid generator (PAG-A or PAG-B), and a basic compound (Base-1) in an organic solvent mixture in accordance with the recipe shown in Table 3. These compositions were each filtered through a nylon or UPE filter having a pore size of 0.02 μm, thereby giving negative resist composition solutions.

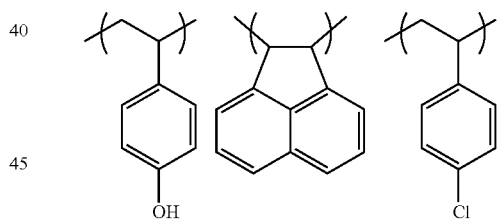
Polymer K

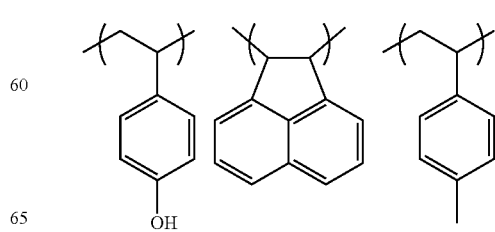
Polymer M

PAG-A

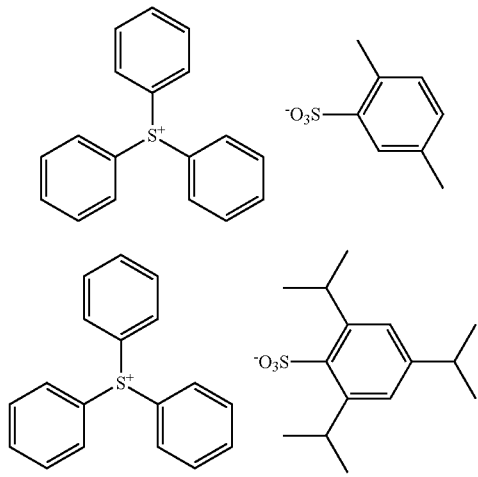

PAG-B

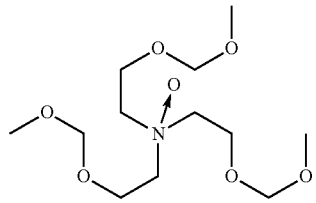

Base-1

The organic solvents used were propylene glycol monomethyl ether acetate (PGMEA) and ethyl lactate (EL). Each solution further contained tetramethoxymethylglycoluril (TMGU) as a crosslinker and 0.075 pbw of a surfactant PF-636 (Omnova Solutions, Inc.).

TABLE 3

| | Resin (pbw) | PAG (pbw) | Base (pbw) | Additive (pbw) | Solvent 1 (pbw) | Solvent 2 (pbw) |
|---|---|---|---|---|---|---|
| Example 1 | Polymer 1 (80) | PAG-A(8) PAG-B(2) | — | TMGU (8.154) | PGMEA (1,109) | EL (2,587) |
| Example 2 | Polymer 2 (80) | PAG-A(8) PAG-B(2) | — | TMGU (8.154) | PGMEA (1,109) | EL (2,587) |
| Example 3 | Polymer 3 (80) | PAG-A(8) PAG-B(2) | — | TMGU (8.154) | PGMEA (1,109) | EL (2,587) |
| Example 4 | Polymer 4 (80) | PAG-A(8) PAG-B(2) | — | TMGU (8.154) | PGMEA (1,109) | EL (2,587) |
| Example 5 | Polymer 5 (80) | PAG-A(8) PAG-B(2) | — | TMGU (8.154) | PGMEA (1,109) | EL (2,587) |
| Example 6 | Polymer 6 (80) | PAG-A(8) PAG-B(2) | — | TMGU (8.154) | PGMEA (1,109) | EL (2,587) |
| Example 7 | Polymer 7 (80) | PAG-A(8) PAG-B(2) | — | TMGU (8.154) | PGMEA (1,109) | EL (2,587) |
| Example 8 | Polymer 8 (80) | PAG-A(8) PAG-B(2) | — | TMGU (8.154) | PGMEA (1,109) | EL (2,587) |
| Example 9 | Polymer 9 (80) | PAG-A(8) PAG-B(2) | — | TMGU (8.154) | PGMEA (1,109) | EL (2,587) |
| Example 10 | Polymer 10 (80) | PAG-A(8) PAG-B(2) | — | TMGU (8.154) | PGMEA (1,109) | EL (2,587) |
| Example 11 | Polymer K (80) | PAG-A(8) PAG-B(2) | Polymer 11 (15) | TMGU (8.154) | PGMEA (1,109) | EL (2,587) |
| Example 12 | Polymer M (80) | PAG-A(8) PAG-B(2) | Polymer 11 (15) | TMGU (8.154) | PGMEA (1,109) | EL (2,587) |
| Example 13 | Polymer K (80) | PAG-A(8) PAG-B(2) | Polymer 12 (15) | TMGU (8.154) | PGMEA (1,109) | EL (2,587) |
| Example 14 | Polymer K (80) | PAG-A(8) PAG-B(2) | Polymer 13 (7) | TMGU (8.154) | PGMEA (1,109) | EL (2,587) |
| Example 15 | Polymer M (80) | PAG-A(8) PAG-B(2) | Polymer 13 (7) | TMGU (8.154) | PGMEA (1,109) | EL (2,587) |
| Example 16 | Polymer K (80) | PAG-A(8) PAG-B(2) | Polymer 14 (7) | TMGU (8.154) | PGMEA (1,109) | EL (2,587) |
| Example 17 | Polymer K (80) | PAG-A(8) PAG-B(2) | Polymer 15 (7) | TMGU (8.154) | PGMEA (1,109) | EL (2,587) |
| Example 18 | Polymer K (80) | PAG-A(8) PAG-B(2) | Polymer 16 (7) | TMGU (8.154) | PGMEA (1,109) | EL (2,587) |
| Example 19 | Polymer K (80) | PAG-A(8) PAG-B(2) | Polymer 17 (7) | TMGU (8.154) | PGMEA (1,109) | EL (2,587) |
| Example 20 | Polymer K (80) | PAG-A(8) PAG-B(2) | Polymer 18 (7) | TMGU (8.154) | PGMEA (1,109) | EL (2,587) |
| Example 21 | Polymer K (80) | PAG-A(8) PAG-B(2) | Polymer 19 (7) | TMGU (8.154) | PGMEA (1,109) | EL (2,587) |
| Example 22 | Polymer K (80) | PAG-A(8) PAG-B(2) | Polymer 20 (3) | TMGU (8.154) | PGMEA (1,109) | EL (2,587) |
| Example 23 | Polymer K (80) | PAG-A(8) PAG-B(2) | Polymer 21 (3) | TMGU (8.154) | PGMEA (1,109) | EL (2,587) |
| Example 24 | Polymer K (80) | PAG-A(8) PAG-B(2) | Polymer 22 (1.1) | TMGU (8.154) | PGMEA (1,109) | EL (2,587) |
| Example 25 | Polymer K (80) | PAG-A(8) PAG-B(2) | Polymer 23 (1.1) | TMGU (8.154) | PGMEA (1,109) | EL (2,587) |

TABLE 3-continued

|  | Resin (pbw) | PAG (pbw) | Base (pbw) | Additive (pbw) | Solvent 1 (pbw) | Solvent 2 (pbw) |
|---|---|---|---|---|---|---|
| Comparative Example 1 | Polymer K (80) | PAG-A(8) PAG-B(2) (1.25) | Base-1 (1.25) | TMGU (8.154) | PGMEA (1,109) | EL (2,587) |
| Comparative Example 2 | Polymer M (80) | PAG-A(8) PAG-B(2) (1.25) | Base-1 (1.25) | TMGU (8.154) | PGMEA (1,109) | EL (2,587) |

*pbw: parts by weight

Evaluation of EB Image Writing

Using a coater/developer system Clean Track ACT-M (Tokyo Electron Ltd.), each of the negative resist compositions was spin-coated onto a 152-mm square mask blank having a chromium oxynitride film at the outermost surface and prebaked on a hot plate at 110° C. for 600 seconds to form a resist film of 80 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 120° C. for 600 seconds, and developed with a 2.38 wt % tetramethylammonium hydroxide aqueous solution, thereby yielding negative patterns.

The patterned wafer was observed under a top-down scanning electron microscope (TDSEM). The optimum exposure (Eop) was defined as the exposure dose ($\mu C/cm^2$) which provided a 1:1 resolution at the top and bottom of a 200-nm 1:1 line-and-space pattern. The maximum resolution of the resist was defined as the minimum line width of a line-and-space pattern that could be resolved and separated at the optimum exposure. The LER of a 100-nm line-and-space pattern was measured under SEM. On observation in cross section of the resist pattern under SEM, it was visually judged whether or not the pattern profile was rectangular. Table 4 tabulates the test results of the inventive and comparative resist compositions on EB image writing.

TABLE 4

|  | Eop ($\mu C/cm^2$) | Maximum resolution (nm) | LER (nm) | Pattern profile |
|---|---|---|---|---|
| Example 1 | 33 | 35 | 3.4 | rectangular |
| Example 2 | 32 | 40 | 3.5 | rectangular |
| Example 3 | 33 | 40 | 3.3 | rectangular |
| Example 4 | 34 | 40 | 3.4 | rectangular |
| Example 5 | 32 | 35 | 3.4 | rectangular |
| Example 6 | 33 | 40 | 3.0 | rectangular |
| Example 7 | 34 | 35 | 3.6 | rectangular |
| Example 8 | 33 | 40 | 3.2 | rectangular |
| Example 9 | 31 | 40 | 3.1 | rectangular |
| Example 10 | 31 | 35 | 3.3 | rectangular |
| Example 11 | 32 | 40 | 3.5 | rectangular |
| Example 12 | 28 | 40 | 3.6 | rectangular |
| Example 13 | 30 | 35 | 3.4 | rectangular |
| Example 14 | 31 | 35 | 3.8 | rectangular |
| Example 15 | 27 | 40 | 3.9 | rectangular |
| Example 16 | 33 | 40 | 3.6 | rectangular |
| Example 17 | 32 | 35 | 3.7 | rectangular |
| Example 18 | 33 | 40 | 3.4 | rectangular |
| Example 19 | 31 | 35 | 3.6 | rectangular |
| Example 20 | 34 | 35 | 3.5 | rectangular |
| Example 21 | 34 | 35 | 3.5 | rectangular |
| Example 22 | 31 | 40 | 3.8 | rectangular |
| Example 23 | 32 | 40 | 3.7 | rectangular |
| Example 24 | 33 | 40 | 3.6 | rectangular |
| Example 25 | 30 | 40 | 3.6 | rectangular |
| Comparative Example 1 | 34 | 60 | 5.7 | undercut |
| Comparative Example 2 | 30 | 60 | 5.8 | undercut |

It is evident from Table 4 that the resist compositions of Examples are improved in resolution and LER over those of Comparative Examples when processed by EB lithography. The chemically amplified negative resist composition of the invention is suited as ultrafine pattern-forming material for VLSI fabrication and mask pattern-forming material by EB lithography.

Japanese Patent Application No. 2010-031020 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition for EB or EUV lithography, comprising (A) an alkali-soluble polymer, (B) an acid generator capable of generating an acid catalyst, and (C) a nitrogen-containing compound as a basic component, said polymer as component (A) turning alkali insoluble under the action of the acid catalyst in the presence or absence of a crosslinker, wherein a basic polymer PB comprising recurring units of the general formulae (1) and (2) and having a weight average molecular weight of 1,000 to 50,000 serves as both components (A) and (C),

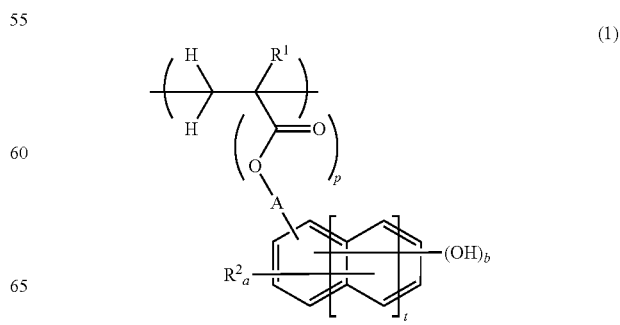

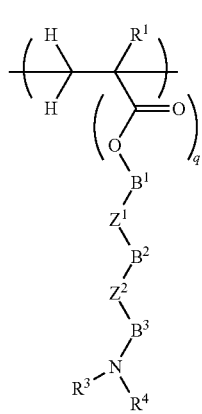

wherein
- A is a single bond or a $C_1$-$C_{10}$ alkylene group which may be separated by an ethereal oxygen atom,
- $R^1$ is each independently hydrogen or methyl,
- $R^2$ is each independently a $C_1$-$C_6$ alkyl group,
- $B^1$, $B^2$, and $B^3$ are each independently a single bond, or a linkage selected from the group consisting of a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing,
- $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—,
- $R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring, $B^3$ may bond with $R^3$ or $R^4$ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring,
- a is an integer of 0 to 4,
- b is a positive integer of 1 to 5,
- p and q are each independently 0 or 1,
- t is an integer of 0 to 2,
- with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group,
- wherein the recurring units of formula (1) are incorporated in a content of at least 64 mol % and the recurring units of formula (2) are incorporated in a content of 0.005 to 10 mol % based on the total recurring units in overall polymers in the resist composition.

2. The resist composition of claim 1 wherein said basic polymer PB further comprises units of the general formula (3):

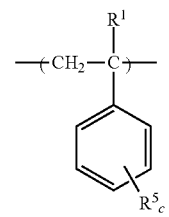

wherein $R^1$ is as defined above, $R^5$ is a halogen atom, optionally halo-substituted $C_1$-$C_6$ alkyl or alkoxy group, optionally halo-substituted $C_2$-$C_7$ alkoxycarbonyl group, alicyclic group, aromatic group, or optionally halo-substituted $C_2$-$C_7$ acyloxy group, and c is an integer of 0 to 5.

3. The resist composition of claim 1 wherein said basic polymer PB further comprises units of the general formula (4) and/or (5):

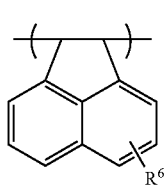

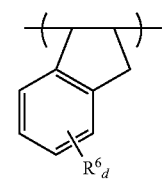

wherein d is an integer of 0 to 4, and $R^6$ is each independently a hydroxyl group, halogen atom, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group.

4. The resist composition of claim 1, further comprising a polymer free of recurring units of formula (2) as part of component (A).

5. The resist composition of claim 1, further comprising a basic compound having a molecular weight of up to 1,000 as part of component (C), the basic compound being present in an amount of up to 1/20 mole per mole of the acid generator (B).

6. The resist composition of claim 1, further comprising a crosslinker which reacts with component (A) in the presence of the acid catalyst for turning component (A) alkali insoluble.

7. The resist composition of claim 1, further comprising a polymer comprising recurring units of the general formula M-1 or M-2 as component (A), wherein the resist composition is free of a crosslinker,

M-1

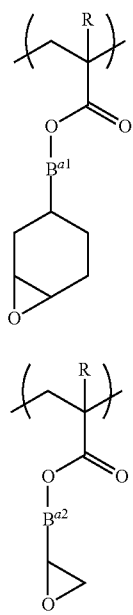

M-2

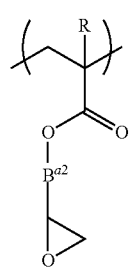

wherein R is hydrogen or methyl, $B^{a1}$ is a single bond or a $C_1$-$C_{10}$ alkylene group which may be separated by an ether bond, $B^{a2}$ is a $C_2$-$C_{10}$ alkylene group which may be separated by an ether bond, with the proviso that when $B^{a1}$ and $B^{a2}$ contain an ether bond, the ether bond is at a remoter position than β-position relative to the ester oxygen.

8. The resist composition of claim 1, wherein the recurring units of formula (1) are incorporated in a content of at least 30 mol % and the recurring units of formula (2) are incorporated in a content of 0.005 to 10 mol % based on the total recurring units in overall polymers in the resist composition.

9. The resist composition of claim 8, wherein said basic polymer PB further comprises units of the general formula (3):

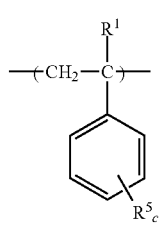
(3)

wherein $R^1$ is as defined above, $R^5$ is a halogen atom, optionally halo-substituted $C_1$-$C_6$ alkyl or alkoxy group, optionally halo-substituted $C_2$-$C_7$ alkoxycarbonyl group, alicyclic group, aromatic group, or optionally halo-substituted $C_2$-$C_7$ acyloxy group, and c is an integer of 0 to 5.

10. The resist composition of claim 8, wherein said basic polymer PB further comprises units of the general formula (4) and/or (5):

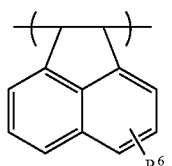
(4)

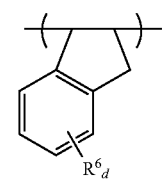
(5)

wherein d is an integer of 0 to 4, and $R^6$ is each independently a hydroxyl group, halogen atom, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group.

11. The resist composition of claim 1, wherein said basic polymer PB further comprises units of the general formula (3):

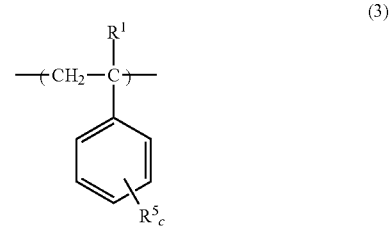

wherein $R^1$ is as defined above, $R^5$ is a halogen atom, optionally halo-substituted $C_1$-$C_6$ alkyl or alkoxy group, optionally halo-substituted $C_2$-$C_7$ alkoxycarbonyl group, alicyclic group, aromatic group, or optionally halo-substituted $C_2$-$C_7$ acyloxy group, and c is an integer of 0 to 5.

12. The resist composition of claim 1, wherein said basic polymer PB further comprises units of the general formula (4) and/or (5):

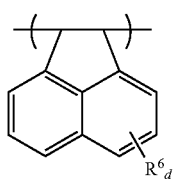
(4)

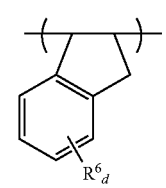
(5)

wherein d is an integer of 0 to 4, and $R^6$ is each independently a hydroxyl group, halogen atom, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group.

13. A pattern forming process comprising the steps of:
applying the negative resist composition of claim 1 onto a processable substrate to form a resist film,
exposing the film patternwise to EB or EUV radiation, and
developing the exposed film with an alkaline developer to form a resist pattern.

14. The process of claim 13 wherein the processable substrate comprises a chromium-containing material at the outermost surface.

15. The process of claim 13 wherein the processable substrate is a photomask blank.

16. A pattern forming process comprising the steps of:
applying the negative resist composition of claim 8 onto a processable substrate to form a resist film,
exposing the film patternwise to EB or EUV radiation, and
developing the exposed film with an alkaline developer to form a resist pattern.

17. A pattern forming process comprising the steps of:
applying the negative resist composition of claim 1 onto a processable substrate to form a resist film,
exposing the film patternwise to EB or EUV radiation, and
developing the exposed film with an alkaline developer to form a resist pattern.

\* \* \* \* \*